(12) United States Patent
Hajimiri

(10) Patent No.: US 11,249,370 B2
(45) Date of Patent: Feb. 15, 2022

(54) OPTICAL PHASED ARRAYS AND METHODS FOR CALIBRATING AND FOCUSING OF OPTICAL PHASED ARRAYS

(71) Applicant: California Institute of Technology, Pasadena, CA (US)

(72) Inventor: Seyed Ali Hajimiri, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 105 days.

(21) Appl. No.: 16/719,874

(22) Filed: Dec. 18, 2019

(65) Prior Publication Data

US 2020/0192179 A1 Jun. 18, 2020

Related U.S. Application Data

(60) Provisional application No. 62/781,541, filed on Dec. 18, 2018.

(51) Int. Cl.
*G02F 1/29* (2006.01)
*G02B 6/293* (2006.01)
*G01R 25/00* (2006.01)

(52) U.S. Cl.
CPC .......... *G02F 1/292* (2013.01); *G02B 6/29313* (2013.01); *G02B 6/29395* (2013.01); *G01R 25/005* (2013.01)

(58) Field of Classification Search
CPC . G02F 1/292; G02B 6/29313; G02B 6/29395; G01R 25/005
See application file for complete search history.

(56) References Cited

U.S. PATENT DOCUMENTS 6,831,600 B1 12/2004 Cherrette et al.
10,061,125 B2 8/2018 Hajimiri et al.
(Continued)

FOREIGN PATENT DOCUMENTS

WO 2018218003 A1 11/2018
WO 2020132126 A1 6/2020

OTHER PUBLICATIONS

International Search Report and Written Opinion for International Application No. PCT/US2019/067262, Search completed Feb. 21, 2020, dated Mar. 19, 2020, 13 pgs.
(Continued)

*Primary Examiner* — John Bedtelyon
(74) *Attorney, Agent, or Firm* — KPPB LLP

(57) ABSTRACT

Optical systems and processes for calibrating and focusing optical systems are described. One embodiment of the invention includes an optical phase array (OPA) and an OPA controller that generates control signals to control phase shifters in the OPA. The OPA controller can calibrate the OPA by performing a plurality of phase sweeps using each of a plurality of different basis masks. Each phase sweep can involve performing a phase sweep across a phase sweep range at a plurality of phase step increments with respect to a first group of phase shifters identified in a basis mask. During the phase sweep, a calibration signal can be measured at each of the plurality of phase step increments and the measurements used to generate calibration phase state information. The calibration phase state information can be utilized to perform functions including (but not limited to) beamforming, focusing, and/or other waveform manipulation and control functions.

20 Claims, 16 Drawing Sheets

(56) References Cited

U.S. PATENT DOCUMENTS

| | | |
|---|---|---|
| 11,112,491 B2* | 9/2021 | Abediasl .............. G02B 26/101 |
| 2005/0255387 A1 | 11/2005 | Butt et al. |
| 2018/0039154 A1 | 2/2018 | Hashemi et al. |
| 2018/0241122 A1 | 8/2018 | Jalali Mazlouman et al. |
| 2019/0056499 A1 | 2/2019 | Fatemi et al. |

OTHER PUBLICATIONS

Abiri et al., "A 1-D Heterodyne Lens-Free Optical Phased Array Camera with Reference Phase Shifting", IEEE Photonics Journal, vol. 10, No. 5, Sep. 2018, DOI: 10.1109/JPHOT.2018.2871823.

Aflatouni et al., "Nanophotonic projection system", Optical Society of America, Aug. 4, 2015, 11 pgs., DOI:10.1364/OE.23.021012.

Chung et al., "A 1024-Element Scalable Optical Phased Array in 0.18 SOI CMOS", 2017 International Solid-State Circuits Conference, 2017, 12 pgs., DOI: 10.1109/ISSCC.2017.7870361.

Fatemi et al., "High sensitivity active flat optics optical phased array receiver with a two-dimensional aperture", Optics Express, vol. 26, No. 23, Nov. 12, 2018, 17 pgs., https://doi.org/10.1364/OE.26.029983.

Horvat, "True Time Domain Bandpass Beamforming", Thesis, Master of Applied Science, Engineering Science, Simon Fraser University, 1998, 104 pgs.

Komljenovic et al., "On-chip calibration and control of optical phased arrays", Optics Express, vol. 26, No. 3, Feb. 5, 2018, 12 pgs., https://doi.org/10.1364/OE.26.003199.

Ortega et al., "Optical Beamformer for 2-D Phased Array Antenna With Subarray Partitioning Capability", IEEE Photonics Journal, vol. 8, No. 3, Jun. 2016, 9 pgs., DOI: 10.1109/JPHOT.2016.2550323.

Poulton et al., "High-Performance Integrated Optical Phased Arrays for Chip-Scale Beam Steering and LiDAR", CLEO, Jan. 2018, 3 pgs., DOI: 1364/CLEO_AT.2018.ATu3R.2.

Vorontsov et al., "Adaptive phase-distortion correction based on parallel gradient-descent optimization", Optics Letters, vol. 22, No. 12, Jun. 15, 1997, pp. 907-909.

\* cited by examiner

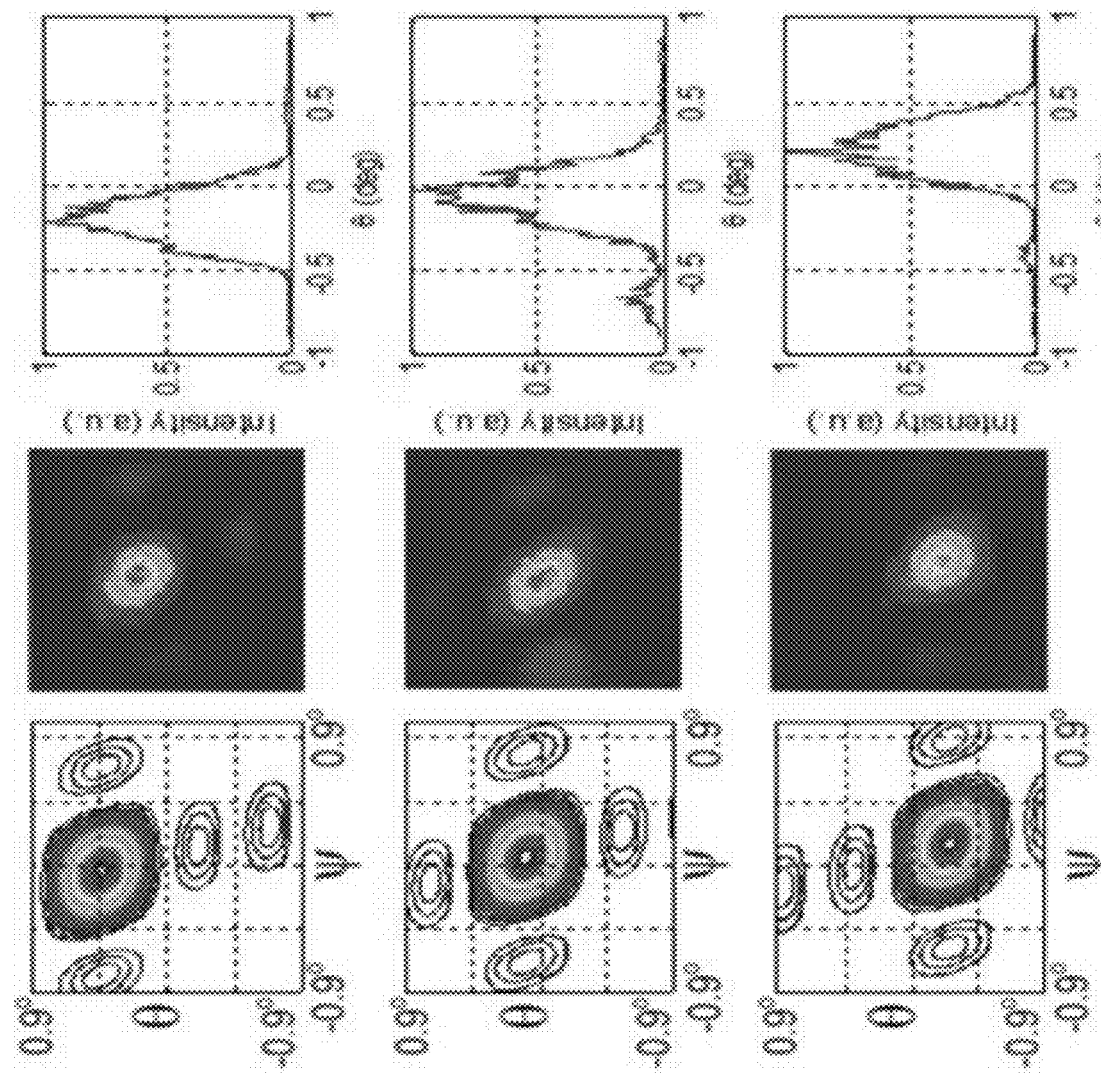

```
Current_SP=0;
best_phase_setting=initial_phase_setting;
Load_OPA best_phase;
for iteration=start_iter to end_iter
    [Ms,Ns]=segment_size(iteration);
    PSR=phase_sweep_range(iteration);
    NPS=number_of_phase_steps(iteration);
    Generate mask({Ms*Ns}) //Generate maskset of size Ms*Ns
    for mask_num=1 to Ms*Ns
        current_mask=mask(mask_num)
        for segment_num=1 to (M*N)/(Ms*Ns)
            for phase_setting=0 to PSR steps PSR/NPS
                for r=1 to Ms
                    for c=1 to Ns
                        phase(r,c)= mod(best_phase_setting (r,c)+current_mask(r,c)*phase_setting,2pi_range(r,c));
                    end
                end
                Load_OPA phase;
                Sensor_Read SP; \\Read sensed power (SP)
                if SP > current_SP then
                    current_SP = SP;
                    for r=1 to Ms
                        for c=1 to Ns
                            best_phase_setting (r,c)= phase(r,c);
                        end
                    end
                endif
            end
            Load_OPA best_phase_settings;
        end
    end
end
```

FIG. 16

OPTICAL PHASED ARRAYS AND METHODS FOR CALIBRATING AND FOCUSING OF OPTICAL PHASED ARRAYS

CROSS-REFERENCE TO RELATED APPLICATIONS

The current application claims priority to U.S. Provisional Patent Application No. 62/781,541, entitled "Fast and Efficient Phase Control and Calibration for Optical Phased Arrays" and filed Dec. 18, 2018, the disclosure of which is incorporated herein by reference in its entirety.

FIELD OF THE INVENTION

The present invention relates generally to optical phased arrays and more specifically to calibration processes for optical phased arrays that incorporate controllable phase shifters.

BACKGROUND

Optical Phased Arrays (OPA) are becoming a prominent component of a large number of optical systems utilized in a broad range of applications including (but not limited to) LiDAR, sensing, imaging, projection, and communications. OPAs are typically constructed from an array of elements designed to either transmit optical signals or receive impinging light. The relative timing and amplitude of the signal transmitted in an OPA transmitter (TX) determines the field pattern in the near and far-field. This field profile can be modified by controlling the amplitude and phase of the optical signal emitted by each of the elements in the array. In this way, an OPA TX can form a beam, focus it on a certain spot, form a collimated (far-field) beam, create multiple beams and nulls, and/or steer the beam(s) in arbitrary directions without the need for any mechanical movements. Similarly, an OPA receiver (RX) can receive and amplify an impinging optical beam from a controllable direction, while suppressing the signal(s) arriving from other directions. In this way, an OPA RX can be configured to produce a "gazing beam" in addition to creating closer-than-infinity focal points. There can be a broad range of applications for all of these different field profiles, and almost all of these applications tend to rely on a precise control of timing (phase) and amplitude (to a lesser degree) as they rely on constructive (and destructive) interference to achieve the above functions.

In an OPA in general, the phase (and amplitude) setting of each element can be independently controlled. The benefits of OPAs often increase with the number of elements and the effective aperture area they cover. For proper operation of an OPA, in each state (e.g., beam direction), there is a setting of phases (and amplitudes) that produces the highest quality field profile with the least amount of spurious special sidelobes and lost energy, namely, highest "efficiency".

For many applications of OPAs it can be important for an efficient phase state to be found and activated as rapidly as possible to make sure that the dynamic behavior of the OPA is not adversely affected. As the number of elements increases, the number of phase (and amplitude) combinations grows exponentially. For example, in an n element array, where each element has m meaningfully distinct phase states, there are $m^n$ potential combinations. This number can become exceedingly large very rapidly, for instance, for a 1,000-element array, with 100 distinct phase states per element, there are $10^{2000}$ different combinations (a one with two thousand zeros in front). Accordingly, the process of identify the most efficient phase state can be computationally challenging.

A variety of processes have been developed for identifying an efficient phase state. One common technique is to sweep a given element's phase, while monitoring the optical signal received at a given bearing in an OPA TX. The term phase sweep describes a process of modifying the phase of a phase shifter across a phase sweep range at specified increments or phase steps. In an ideal scenario, the received signal strength will change during the phase sweep enabling identification of a more efficient phase state. Generally speaking, in the absence of any noise or coupling between the elements, the optimum phase setting can be found in linear time by keeping track of the phase settings that led to the largest signal during a phase sweep and repeating this process for all elements. Processes that sweep the phases of individual elements in this manner are often referred to as "gradient descent approaches".

In an effort to achieve faster convergence, a stochastic parallel gradient descent process (SPGD) has been proposed for use with OPAs. In SPGD, each phase shifter has a positive phase perturbation or a negative phase perturbation of equal magnitude applied to its initial phase state with equal probability. A gradient is determined by comparing a calibration measurement for the initial phase state with a calibration measurement for the perturbed phase state. A new phase state can then be determined based upon the gradient and a step size parameter and the process of the random perturbations and gradient descent repeat until an optimal phase state is identified.

SUMMARY OF THE INVENTION

Systems and methods in accordance with various embodiments of the invention utilize OPAs that are calibrated using phase state information determined by applying phase sweeps to groups of phase shifters within the array. In a number of embodiments, the OPAs can operate reliably in noisy and interference-prone environments due to their higher dynamic range and multi-layer adaptive nature. In addition, the ability of OPAs in accordance with many embodiments of the invention to operate adaptively means that the convergence time for achieving an efficient phase state for the OPA can be significantly shorter than the convergence times of conventional OPAs. Systems and method in accordance with a number of embodiments of the invention can be utilized to perform beamforming, focusing, and/or other waveform manipulation and control functions. In addition, OPA TX or OPA RX systems in accordance with several embodiments of the invention can achieve high beam focusing quality.

To achieve the best beam quality and field profile formation by an OPA (whether an OPA transmitter or a receiver), precise phase adjustments are made in the presence of non-idealities including (but not limited to) large quantities of noise in the sensed signal, and/or strong coupling between elements (for example, optical or thermal coupling). As a result, conventional gradient descent approaches have a tendency to fail as the number of elements increases. This is mainly due to the gradient descent approach relying upon detection of minor fluctuations in the received power in the presence of noise and interference. As the number of elements increases, noise can swamp the variations that result from sweeping the phase of a single element. Accordingly, the sensitivity of this process tends to be reduced significantly when used in an OPA including a large array of elements, because incorrect decisions are made due to variations dominated by noise. In this way, OPAs that include a large array of elements are often configured using grossly suboptimal settings by relying upon gradient descent approaches. This can be further hampered by the coupling among the elements that leads to variations in the optimal setting when such coupling exists.

OPAs in accordance with many embodiments of the invention use a process for identifying an efficient phase state that is adaptive, and dynamic. In a number of embodiments, the process utilizes a set of basis masks to determine the manner in which to apply phase sweeps to groups of phase shifters in an OPA during successive iterations of the calibration process to identify an optimal phase state. In this way, OPA phase (and amplitude) settings for an OPA TX and/or OPA RX can be adjusted to arrive at an optimum phase state for performing functions including (but not limited to) beamforming, focusing, and/or other waveform manipulation and control functions. In most applications (e.g., LiDAR, imaging, and projection, and communications, etc.) the speed and accuracy of the process of honing into the optimum (or near optimum) phase settings is of great significance in practical systems. The prior art approaches are significantly lacking in such scenarios. Simultaneous application of phase sweeps to multiple phase shifters can result in substantial improvement in the robustness of the approach to environmental variables such as temperature and to system non-idealities such as thermal and optical crosstalk. Accordingly, OPAs in accordance with certain embodiments of the invention can achieve a high quality of beam forming, speed of convergence, robustness, and/or versatility. In addition, the systems and methods described herein are not limited to OPAs but can be utilized in any of a variety of systems including (but not limited to) multiple element phased arrays for communication and/or sensing, sensors arrays, multiple static sensors, multiple array projection systems, and/or holographic systems at various wavelengths of the electromagnetic spectrum. Accordingly, systems and methods in accordance with various embodiments of the invention should be understood to be generally applicable and not limited to any of the specific systems described herein.

One embodiment of the invention includes: an optical phase array (OPA) comprising a plurality of branches that are each connected to optical elements and each include a phase shifter, where each phase shifter is controllable via control circuitry; and an OPA controller configured to generate control signals to control the phase of the phase shifters in the OPA via the control circuitry. In addition, the OPA controller is further configured to perform a calibration process including sending control signals to the OPA control circuitry to perform a plurality of phase sweeps using each of a plurality of different basis masks. Furthermore, each phase sweep includes: performing a phase sweep across a phase sweep range at a plurality of phase step increments with respect to a first group of phase shifters identified in a basis mask, where the first group of phase shifters comprises a plurality of phase shifters; and measuring a calibration signal at each of the plurality of phase step increments during the phase sweep. Additionally, the calibration process also involves generating calibration phase state information based upon the measured calibration signals.

In a further embodiment, the OPA controller is configured to perform beamforming using the OPA by sending control signals to the OPA control circuitry based upon the calibration phase state information.

In another embodiment, each phase sweep further comprises maintaining the phase offset of a second group of phase shifters identified in the basis mask during the phase sweep, where the second group of phase shifters does not include any of the phase shifters from the first group.

In a still further embodiment, each phase sweep further comprises simultaneously performing an opposite phase sweep across the phase sweep range at a plurality of negative phase step increments with respect to a second group of phase shifters identified in the basis mask, where the second group of phase shifters does not include any of the phase shifters from the first group.

In still another embodiment, the size of the basis masks from the plurality of different basis masks changes between at least some of the plurality of phase sweeps.

In a yet further embodiment, the size of the basis masks increases between at least some of the plurality of phase sweeps.

In yet another embodiment, the phase sweep range changes between at least some of the plurality of phase sweeps.

In a further embodiment again, over the course of the plurality of phase sweeps the size of the basis masks increases, and the size of the phase sweep range decreases.

In another embodiment again, the phase step increment changes between at least some of the plurality of phase sweeps.

In a further additional embodiment, over the course of the plurality of phase sweeps the size of the basis masks increases, the size of the phase sweep range decreases, and the size of the phase step increment decreases.

In another additional embodiment, the phase sweep range changes between at least some of the plurality of phase sweeps.

In a still yet further embodiment, the phase step increment changes between at least some of the plurality of phase sweeps.

In still yet another embodiment, the plurality of different basis masks comprises a set of basis masks that are orthogonal.

In a still further embodiment again, the plurality of different basis masks comprises a set of basis masks that are nearly orthogonal.

In still another embodiment again, the OPA is configured as an OPA transmitter.

In a still further additional embodiment, the OPA transmitter further comprises an input into which an optical input can be coupled and a splitter network, each phase shifter is configured to receive the optical input from the splitter network and apply a phase shift to the received optical input, and the optical elements are radiating antenna elements that form a radiating antenna array.

In still another additional embodiment, the OPA is configured as an OPA receiver.

In a yet further embodiment again, each optical element is configured to couple incident light into the optical branch to which it is connected, the optical branch comprises a directional coupler configured to perform heterodyne mixing of a received optical signal with a reference signal, and the phase shifter is configured to apply a phase shift to the reference signal.

A further embodiment includes: an optical phase array (OPA) comprising a plurality of branches that are each connected to separate optical elements and each include a phase shifter, where each phase shifter is controllable via control circuitry; and an OPA controller configured to generate control signals to control the phase of the phase shifters in the OPA via the control circuitry. In addition, the OPA controller is further configured to perform a calibration process including. sending control signals to the OPA control circuitry to perform a plurality of phase sweeps using each of a plurality of different basis masks. Furthermore, each phase sweep includes: performing a phase sweep across a phase sweep range at a plurality of phase step increments with respect to a first group of phase shifters identified in a basis mask, where the first group of phase shifters comprises a plurality of phase shifters; and measuring a calibration signal at each of the plurality of phase step increments during the phase sweep. Additionally, the calibration comprises generating calibration phase state information based upon the measured calibration signals. As a further aspect, the size of the basis masks from the plurality of different basis masks changes between at least some of the plurality of phase sweeps, the phase sweep range changes between at least some of the plurality of phase sweeps, the phase step increment changes between at least some of the plurality of phase sweeps, and the OPA controller is configured to perform beamforming using the OPA by sending control signals to the OPA control circuitry based upon the calibration phase state information.

An embodiment of the method of the invention for calibrating an optical phase array (OPA) including a plurality of branches that are each connected to separate optical elements and each include a phase shifter includes: sending control signals to control circuitry in the OPA to perform a plurality of phase sweeps using each of a plurality of different basis masks, where each phase sweep includes: performing a phase sweep across a phase sweep range at a plurality of phase step increments with respect to a first group of phase shifters identified in a basis mask, where the first group of phase shifters comprises a plurality of phase shifters; and measuring a calibration signal at each of the plurality of phase step increments during the phase sweep. In addition, the method includes generating calibration phase state information based upon the measured calibration signals.

An optical phase array (OPA) transmitter in accordance with an embodiment of the invention includes: a plurality of branches that each comprise a phase shifter connected to an optical element, where each phase shifter is controllable via control circuitry; and an OPA controller configured to generate control signals to control the phase of the phase shifters in the OPA via the control circuitry. In addition, the OPA controller is further configured to perform a calibration process including sending control signals to the OPA control circuitry to perform a plurality of phase sweeps using each of a plurality of different basis masks. Furthermore, each phase sweep includes: performing a phase sweep across a phase sweep range at a plurality of phase step increments with respect to a first group of phase shifters identified in a basis mask, where the first group of phase shifters comprises a plurality of phase shifters; and measuring an optical signal transmitted by the OPA at each of the plurality of phase step increments during the phase sweep. Additionally, the calibration process includes generating calibration phase state information based upon the measured optical signals.

In a further embodiment, the OPA transmitter further comprises an input into which an optical input can be coupled and a splitter network, each phase shifter is configured to receive the optical input from the splitter network and apply a phase shift to the received optical input, and the optical elements are radiating antenna elements that form a radiating antenna array.

An optical phase array (OPA) receiver in accordance with an embodiment of the invention includes: a plurality of branches that each comprise a phase shifter and an optical element, where each phase shifter is controllable via control circuitry; and an OPA controller configured to generate control signals to control the phase of the phase shifters in the OPA via the control circuitry. In addition, the OPA controller is further configured to perform a calibration process includes sending control signals to the OPA control circuitry to perform a plurality of phase sweeps using each of a plurality of different basis masks. Additionally, each phase sweep includes: performing a phase sweep across a phase sweep range at a plurality of phase step increments with respect to a first group of phase shifters identified in a basis mask, where the first group of phase shifters comprises a plurality of phase shifters; and measuring a calibration optical signal received by the OPA at each of the plurality of phase step increments during the phase sweep. Additionally, the calibration process includes generating calibration phase state information based upon the measured calibration optical signals.

In another embodiment, each optical element is configured to couple incident light into the optical branch to which it is connected, the optical branch further comprises a directional coupler configured to perform heterodyne mixing of a received optical signal with a reference signal, and the phase shifter is configured to apply a phase shift to the reference signal.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 7A-7C show a comparison between measured vertical beam spot movements and corresponding simulations.

FIG. 16 is example pseudocode that can be used to implement a calibration process in accordance with an embodiment of the invention.

DETAILED DISCLOSURE OF THE INVENTION

Figure 1:
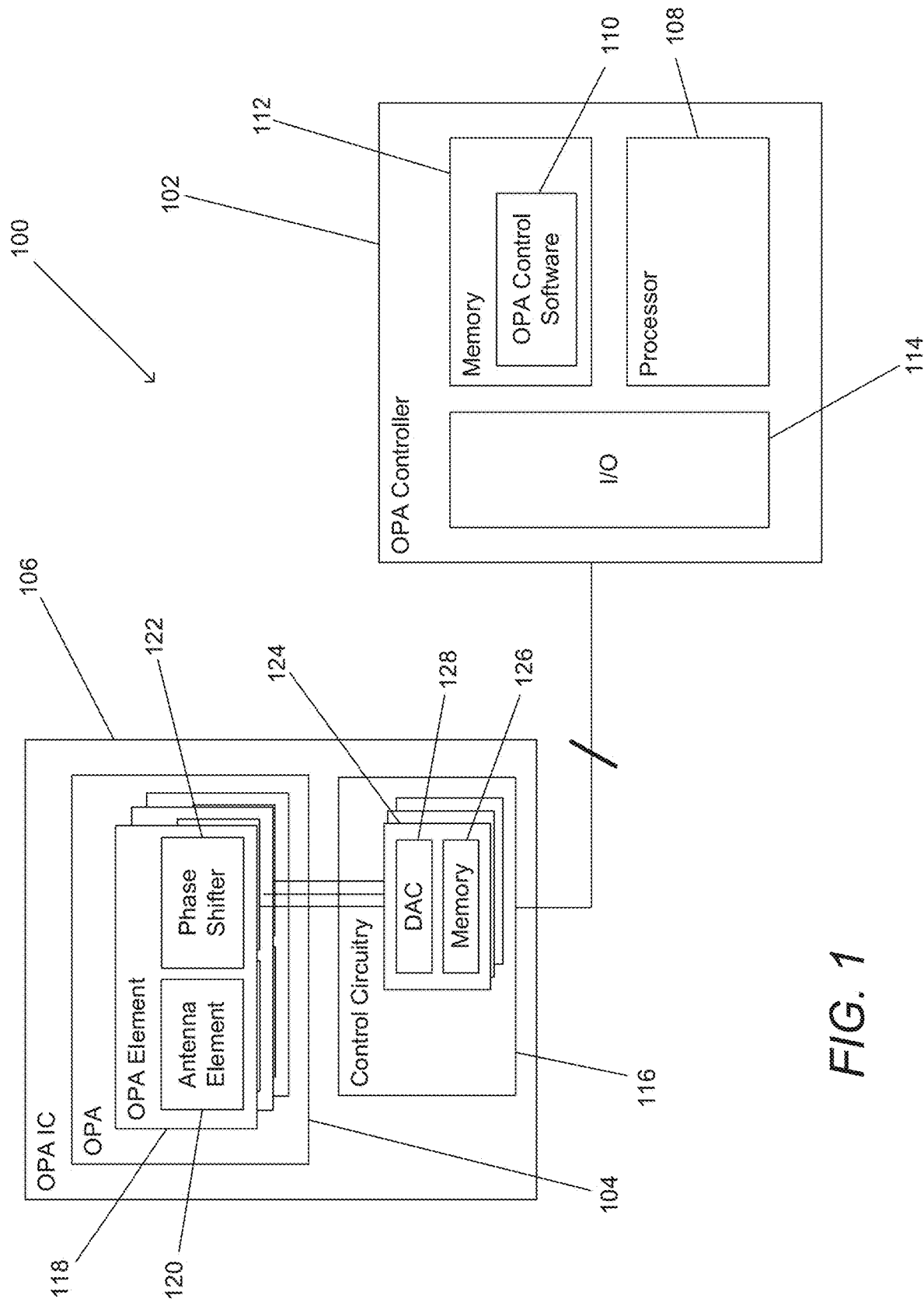
FIG. 1 shows a general architecture for an OPA in accordance with an embodiment of the invention.

Turning now to the drawings, optical systems and processes for controlling and/or calibrating optical systems in accordance with various embodiments of the invention are illustrated. In many embodiments, the optical system includes an OPA and utilizes calibration phase state information to perform functions including (but not limited to) beamforming, focusing, and/or other waveform manipulation and control functions. Processes in accordance with various embodiments of the invention can be utilized to determine phase state calibration information for optical systems including (but not limited to) optical systems that include OPA transmitters (TXs) or OPA receivers (RXs).

In several embodiments, the calibration process applies phase sweeps to groups of phase shifters within an OPA and observes changes in one or more calibration signals. In the case of an OPA TX, the calibration signal can be generated by a sensor positioned in a known location relative to the OPA. In the case of an OPA RX, the calibration signal can be the signal detected by the OPA RX in response to illumination by a well characterized light source. By applying phase sweeps to groups of phase shifters in an array, a larger variation in the dynamic range of the calibration signal is observed during the phase sweep. Accordingly, the observed variations can significantly exceed the noise within the system enabling more accurate identification of the combination of phase shift settings that result in the greatest improvement in the performance of the OPA. When successive groups of phase shifters to which phase sweeps are applied are selected appropriately, an optimal phase state for an optical system can be identified more reliably and more rapidly than can be achieved through conventional gradient descent.

In the context of optical systems, a variety of different phase states can constitute an optimal phase state. For example, the optimal phase state may be the phase state that is the most efficient. In several embodiments, the optimal phase state is the phase state that is the most efficient phase state that can be identified within a certain period of time and/or amount of computation. In a number of embodiments, the optimal phase state can be the first phase state that satisfies a calibration criterion during the calibration process. In certain embodiments, the quality of a phase state can be determined by capturing information across the field of view of an OPA. For example, an OPA RX calibration process can evaluate sensitivity in a first direction and noise rejection in other directions. Similarly, an OPA TX calibration process can look at the amount of power in a main beam direction and the amount of power in sidelobes. Accordingly, it should be appreciated that a phase state selected by the calibration process is not necessarily the global optimum (i.e. best of all possible phase states). Quite the contrary, the phase state selected by the calibration process is routinely sub-optimal. Therefore, references to a phase state as being optimal herein should be understood to a refer not only to the globally optimal phase state, but to any phase state that meets criteria established by the calibration process as being suitable for configuring an OPA to perform beamforming. Indeed, a calibration process may in fact identify multiple potential phase states as being optimal through the application of phase sweeps to groups of phase shifter within the OPA and the OPA can determine the specific phase state that is most appropriate to the requirements of a given application.

In a number of embodiments, the manner in which phase sweeps are applied to groups of phase shifters is determined based upon a series of basis masks. As is discussed below, the basis masks can enable the calibration space to explore all possible phase states (i.e. the basis masks form a complete basis for the phase state of the system). In several embodiments, the basis masks only enable efficient exploration of a subset of all possible phase states of the system (i.e. the basis masks form an incomplete basis for the phase state of the system). Use of basis masks that form an incomplete basis can be advantageous in circumstances where prior information can guarantee that an optimal or near-optimal calibration can be obtained rapidly by only searching within a subset of all possible phase states for the system. In many embodiments, the basis masks form an orthogonal or nearly orthogonal basis, which can (in some applications) simplify the implementation of the calibration process.

The basis mask sets do not need to be applied to the full size of an array. In a number of embodiments, the array is broken down into smaller segments, where, within each segment, the appropriate set of basis masks determines the manner in which phase sweeps are applied to particular phase shifters. In several embodiments, the size of the segments, the basis masks sets applied to each segment, the phase sweep ranges of the phase sweeps and the number of phase steps (or the phase step increment) can all be different within different overall iterations of a calibration loop.

In a number of embodiments, the overall calibration process involves one or multiple iterations of a process of performing phase sweeps using a set of masks with respect to each segment in an array. The loop can start from a random initial state or use previously evaluated phase settings as a starting point to obtain faster convergence to an optimum phase setting. In each iteration, the phase sweep range, the phase step increment, and the segment sizes can change. Larger phase step increments can produce a smaller number of calibration signal measurements to be evaluated, which can result in a higher speed of operation and lower complexity. Reducing the phase sweep range can refine the phase offsets applied to specific phase shifters within the array. In many embodiments, reductions in the phase sweep range can occur in the later stages of the optimization, where the calibration process effectively performs fine tuning of the phase settings. In many embodiments, smaller segment sizes can be used in the early iterations in combination with a relatively larger phase sweep range. Due to large changes in the phase of elements with respect to each other, a large change in the calibration signal can be observed and the larger dynamic range allows for a smaller number of elements to be changed in each step (e.g. smaller segment sizes). In a number of embodiments, as the main loop progresses, and the coarse phase tuning transitions toward finer tuning (e.g. smaller phase sweep ranges), the variation in the amplitude becomes smaller and larger segmentations (potentially up to full array size) can be utilized as the larger number of elements can generate larger power in the calibration signal despite the smaller PSR. As can readily be appreciated the specific manner in which the calibration process is configured is largely dependent upon the requirements of a specific system such as (but not limited to) an OPA TX or OPA RX.

While OPAs and processes for calibrating OPAs in accordance with various embodiments of the invention are discussed further below, systems and methods in accordance with various embodiments of the invention should be understood as not limited to optical systems that include OPAs but can be extended to any optical system and/or system that operates in another portion of the electromagnetic spectrum that utilizes an array of elements and having controllable phase shifters that are utilized to perform functions including (but not limited to) beamforming, focusing, and/or other waveform manipulation and control functions.

OPA Architectures

Systems and methods in accordance with various embodiments of the invention can utilize any of a variety of OPA architectures. Accordingly, the systems and methods described herein should be understood as not being limited to any specific OPA architecture. Quite the contrary, the methods described herein for OPA TX and RX calibration and/or beamforming should be understood as being adaptable to any OPA that utilizes phase control to perform functions including (but not limited to) beamforming, focusing, and/or other waveform manipulation and control functions.

A general architecture for an OPA in accordance with an embodiment of the invention is conceptually illustrated in FIG. 1. The OPA system 100 includes an OPA controller 102 and an OPA 104 that is implemented upon an OPA integrated circuit (IC) 106. As can readily be appreciated, the illustrated OPA system 100 is generalized to be able to describe the features common to both an OPA TX and an OPA RX. The configuration of the various components described with respect to FIG. 1 is dependent upon whether the OPA is an OPA TX or an OPA RX.

Referring specifically the OPA controller 102, the OPA controller includes a processor 108 that can be configured by OPA control software 110 stored in memory 112. The OPA control software 110 can configure the processor to perform a variety of functions with respect to the OPA 104 including (but not limited to) calibrating the OPA and/or determining phase settings in order to perform beamforming. As can readily be appreciated, the specific functions performed by the OPA controller largely depend upon the particular OPA configuration (e.g. OPA TX or OPA RX) and/or the requirements of the specific application of the OPA.

While the OPA control software 110 is referred to as software, the OPA control software can also be implemented in firmware. Furthermore, the OPA controller can also be implemented using an FPGA or as an ASIC. Indeed, in many embodiments, OPA controller circuitry is incorporated into an OPA IC.

Where the OPA controller is separate from the OPA IC, the OPA controller 102 provides instructions to the OPA IC using an input/output interface 114. In several embodiments, the instructions are provided as digital signals to control circuitry 116 within the OPA IC. As is discussed further below, these instructions can be utilized to control the operation of the OPA IC.

As noted above, the OPA IC 106 includes an OPA 104. The OPA 104 is made up of a number of OPA elements 118. In the illustrated embodiment, each OPA element 118 includes an antenna element 120 and a controllable phase shifter 122. The specific structure of each OPA element depends upon the configuration of the OPA (e.g. OPA TX or OPA RX) and a variety of different OPA TX and OPA RX structures are discussed further below.

The controllable phase shifter 112 apply phase shifts to optical signals, where the amount of the applied phase shift is determined by control signals received from the control circuitry 116. In many embodiments, the control signals are analog signals that are generated by OPA element control circuitry 124. In the illustrated embodiment, the OPA control circuitry includes a memory 126 that is utilized to buffer a control parameter and a digital to analog converter (DAC) 128 that is utilized to convert the control parameter into an analog control signal. As can readily be appreciated, the specific manner in which OPA element control circuitry is implemented is largely dependent upon the nature of the phase shifters utilized within the OPA. Accordingly, any of a variety of phase shifters and OPA element control circuity can be utilized as appropriate to the requirements of specific applications in accordance with various embodiments of the invention.

Non-Linearities and Noise within OPAs

Due to the central role of phase (and amplitude) control in the proper operation of OPAs, it can be useful to calibrate and correct the phase shift of each branch to produce a coherent wave-front in an OPA TX or receive an impinging wave-front in an OPA RX. For a steerable phased array, the phase shift in each OPA element 118 can be controlled by its phase shifter 122, which can operate based on different principles, including but not limited to thermal index change, carrier induced phase shifters, and/or Kerr effect. Various mechanisms offer different benefits and drawbacks, but in general all of them are typically subject to nonlinearity in the phase response with respect to the phase controlling input (for example, voltage or current) and can experience element-to-element variations, where the same input does not produce the same phase shift for two elements with similar nominal design.

In the case of a centralized optical signal distribution within the OPA 104, path length differences in the signal distribution lines can also result in a rather arbitrary initial phase for the array. For instance, at wavelength of $\lambda=1{,}550$ nm, a path length difference of roughly 250 nm ($\frac{1}{4{,}000{,}000}$ meter) in a silicon waveguide can result in almost complete phase reversal ($\sim 180°$). In the case of large uncontrolled distribution networks, this can result in practically random initial phase. Even in the case of a length matched distribution network, slight variation in features including (but not limited to) the length, dielectric constant, adjacency to other dielectric and conductive materials, imperfection in the crystal, and/or coupling variations can cause variations in the initial phase that would need to be dynamically adjusted and corrected for the array to operate properly. Similar issues can be observed in virtually all types of OPA architectures including (but not limited to) signal path optical phase shifting OPAs, base-band digital phase shifting OPAs, and/or homodyne and heterodyne LO path phase shifting OPAs. Furthermore, these issues exist in both receiver and transmitter array architectures.

Calibrating OPAs

In order to perform functions including (but not limited to) beamforming, focusing, and/or other waveform manipulation and control functions, OPAs in accordance with various embodiments of the invention can undergo a calibration process to determine corrections for non-linearities. In the case of an OPA TX, calibration can be performed by adjusting the phase of phase shifters within the OPA and measuring the power in a particular beam direction or beam directions. Power detection can be done in a variety of ways in the near or far field. These include, but are not limited to, using a photodiode, using a camera (CCD or otherwise), using an image sensor array (CCD, CMOS, etc.), or other localized field sensors in a variety of configurations. For an OPA RX, any external source, be it a point source (laser or otherwise) or a naturally occurring signal source can be used during the calibration process to illuminate the OPA and the received signal strength observed as the phases of the phase shifters within the OPA are modified.

In many embodiments, the calibration process involves the OPA simultaneously modifying groups of phase shifters in a coordinated manner to determine a calibration phase state. By performing phase sweeps with respect to groups of phase shifters, the calibration process can generate much larger changes in a calibration signal than can be observed by modifying a single phase shifter and/or randomly applying fixed positive or negative phase perturbations to all the phase shifters. In this way, calibration processes in accordance with various embodiments of the invention tend to be more robust to noise than conventional OPA calibration processes. By analyzing the change in the calibration signal in response to the phase sweeps, a determination can be made concerning the specific phase state or phase states that achieve efficient beamforming. Information concerning efficient phase state(s) can then be utilized to generate calibration data for use in subsequent beamforming and/or beam steering.

In several embodiments, multiple phase sweeps are performed using a different group of phase shifters during each phase sweep. The group of modulators to which a phase sweep is applied can be referred to as a segment of the OPA or segment. Within each segment a basis mask can be utilized to determine the nature of the phase sweep applied to a particular modulator within the group. In several embodiments, the basis mask determines whether the phase sweep involves positive phase step increments or negative phase step increments over a phase sweep range. In a number of embodiments, the basis masks determine whether or not a phase sweep is applied to a particular modulator. In many embodiments, the basis mask can include any value including (but not limited to) a value that can be utilized to modify the manner in which a phase step increment is applied to a phase shifter (e.g. signed integers, real numbers, or complex numbers, to name a few additional possibilities).

As is discussed in detail below, the selection of the basis masks (masks) utilized within a calibration process can determine the extent to which the calibration process can identify an optimal phase state for performing beamforming using the OPA and/or the speed with which the optimal phase state can be identified. While not necessary, the use of orthogonal or quasi-orthogonal masks can facilitate evaluation of the optimum phases for multiple masks independently and sequentially without the need to update the OPA phase settings after each phase sweep. This can be particularly useful in the presence of latency or speed limitations for communications between an OCA and an OCA controller. The orthogonal and quasi-orthogonal masks can enable the phase sweeps to be done independently and the aggregate result effectuated after a predefined number of masks have gone through the phase sweep.

In many embodiments, the calibration process is able to identify a phase state that enables efficient beamforming by repeating the process of performing phase sweeps with respect to different segments of the OPA using different segment sizes, segment shapes, basis masks, phase step increments, and/or phase ranges. The segment sizes, basis masks, phase step increment size and/or phase ranges utilized during the calibration process can be designed to rapidly identify the phase state that optimizes a calibration signal. As a general rule, large phase step increments produce significant changes in a calibration signal. In addition, increasing the size of a segment also increases the impact of a phase step increment on a calibration signal. Therefore, calibration processes in accordance with a number of embodiments of the invention commence with comparatively smaller segment sizes and larger phase step increments. As the calibration progresses, the phase step increments can be reduced to provide refinement of the phase state. In order to observe the effect of these smaller phase step increments in the presence of noise, the size of the segments can be increased as the phase step increments are decreased. Processes for selecting segment shape and/or size, generating masks, and/or determining phase step increment size and/or phase ranges utilized when performing phase sweeps during a calibration process in accordance with various embodiments of the invention are discussed further below.

Figure 2:
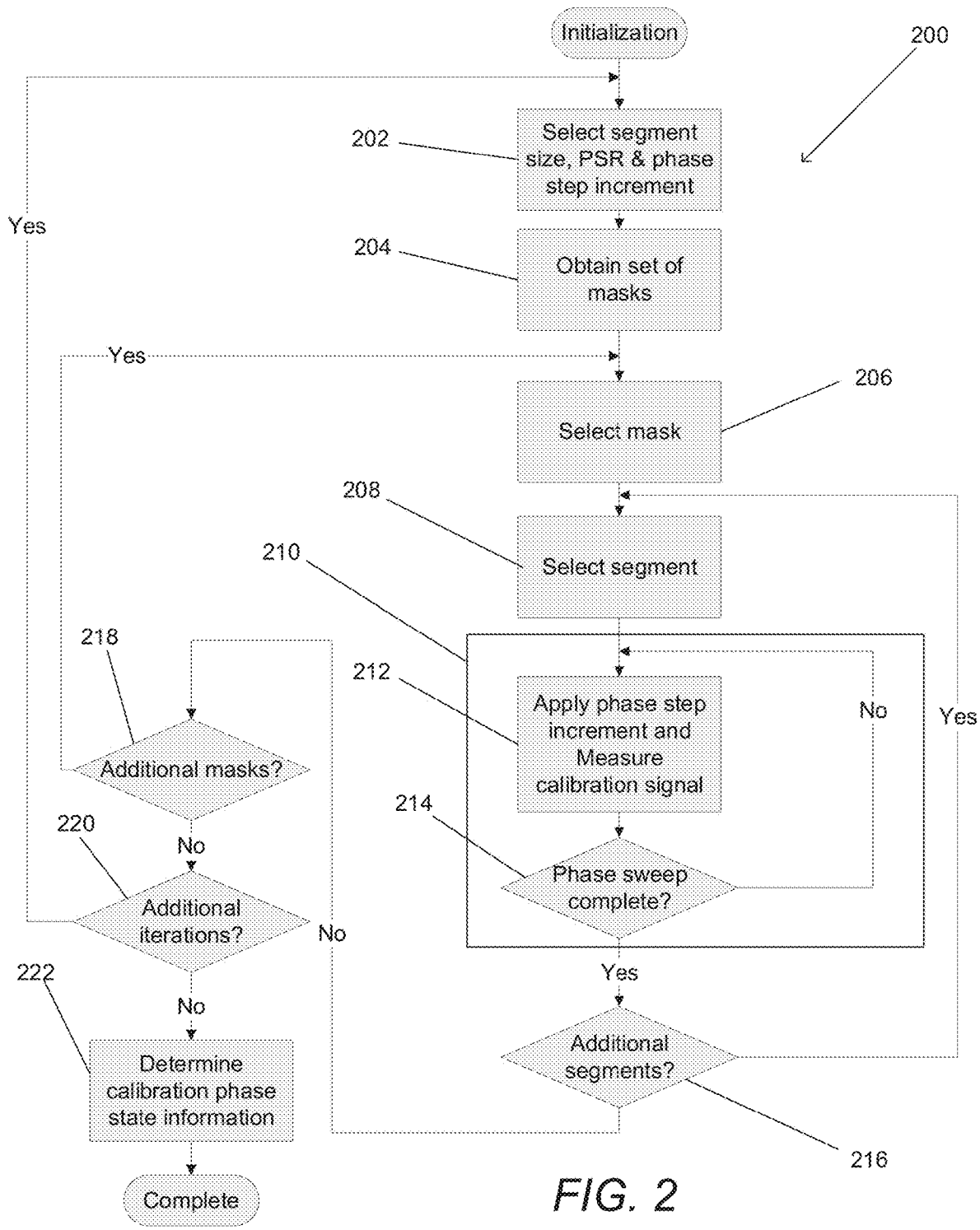
FIG. 2 illustrates a process for calibrating the phase offsets for phase shifters in an OPA based upon measurements of a calibration signal in accordance with an embodiment of the invention.

A process for calibrating the phase offsets for phase shifters in an OPA based upon measurements of a calibration signal in accordance with an embodiment of the invention is illustrated in FIG. 2. The calibration process 200 is initialized by selecting an initial phase state and making a calibration signal measurement made with respect to the initial phase state. In addition, an initial segment size and shape, an initial phase sweep range (PSR), and an initial phase step increment are selected (202). A set of masks appropriate to the selected segments can also be obtained (204) and a first mask is selected (206). In a number of embodiments, the masks are pre-generated and retrieved from memory. In several embodiments, the masks are generated based upon the segment size and shape.

A set of phase sweeps can be performed with respect to the phase shifters in the OPA using the selected mask. In several embodiments, the phase sweeps are performed separately with respect to different segments of the OPA. A first segment is selected (208) based upon the initial phase step increment. A phase sweep is performed (210) with respect to the phase shifters in the segment in a manner determined based upon the mask, the phase sweep range, and the phase step increment.

In the illustrated embodiment, the phase sweep involves applying (212) phase step increments to the phases of the phase shifters within the segment in accordance with the selected mask. The calibration signal can then be measured. The process of incrementing the phases of the phase shifters within the segment in accordance with the selected mask and measuring the calibration signal continues until a determination (214) is made that the phase sweep of the selected phase sweep range is complete. When the phase sweep is complete, the process selects new segments until a determination (216) is made that a phase sweep has been performed in accordance with the selected mask on all segments of the OPA. At which point, the process selects additional masks and repeats the process of performing phase sweeps with respect to each segment in accordance with the selected mask until a determination (218) is made that there are no additional masks.

When each mask in the initial set of masks has been used, the process can then perform another iteration selecting (202) a new segment size and shape, a new phase sweep range, and a new phase increment step. A new set of masks is obtained (204) based upon the new segment size and shape and phase sweeps can be performed on the new segments in accordance with the new set of masks and based upon the phase new sweep range and phase increment step. As noted above, calibration processes in accordance with many embodiments of the invention have a tendency to proceed by utilizing smaller phase increment steps and larger segments. As can readily be appreciated, the specific manner in which the segment sizes and are selected during the calibration process, the specific masks that are utilized, and/or the manner in which the phase sweep ranges, and/or phase step increments are modified during successive iterations are largely dependent upon the requirements of specific applications. The phase sweeps continue until a determination (220) is made that the calibration process is complete. At which point, the OPA can be configured (222) using the calibration phase state information generated by the calibration process.

While specific calibration processes are described above with respect to FIG. 2, any of a variety of processes for calibrating phase shifters within OPAs including (but not limited to) processes that use a single set of masks, processes that do not divide the OPA up into segments, processes that do not change the segment size during the calibration process, and/or processes that do not change the phase sweep range during the calibration can be utilized as appropriate to the requirements of given applications in accordance with various embodiments of the invention. In addition, processes can be implemented that apply phase sweeps to each segment using the complete set of masks before moving on to the next segment. Indeed, the ordering of the steps of the calibration processes described above with reference to FIG. 2 can be varied as appropriate to the requirements of specific applications. While the process described above with respect to FIG. 2 are described in the context of OPAs, a similar process can also be performed with respect to the calibration of any system that includes an array of elements and in which phase shifters are utilized to perform functions including (but not limited to) beamforming, focusing, and/or other waveform manipulation and control functions. In order to provide additional context for the specific manner in which calibration processes in accordance with various embodiments of the invention can be utilized, a number of specific OPA TX and OPA RX architectures are discussed below prior to providing a more detailed discussion of calibration and the generation of basis masks.

OPA TXs

A variety of OPA TX architectures are known. As noted above, processes in accordance with various embodiments of the invention can be utilized in the calibration of any typical OPA TX architecture.

Figure 3:
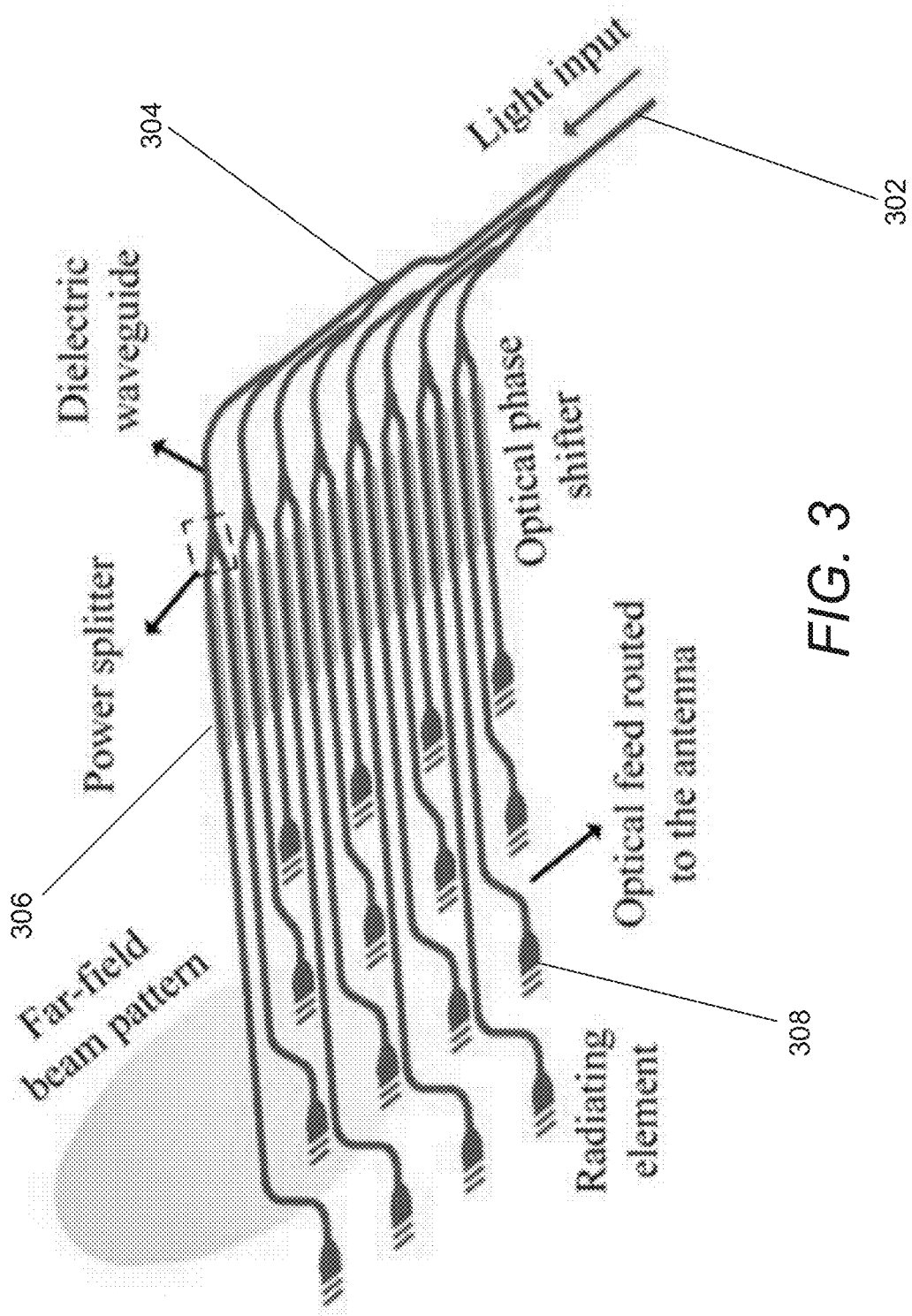
FIG. 3 illustrates a common OPA TX architecture incorporating phase shifters.

A common OPA TX architecture incorporating phase shifters is illustrated in FIG. 3. The OPA TX 300 includes a single laser source 302, which is divided into multiple optical branches 304 with an independently controlled optical phase shifter 306 on each branch. Each branch feeds an optical antenna element 308 and the optical antenna elements collectively form an array of emitters. By adjusting the phase shifters, a controllable coherent optical wave front can be formed. Indeed, when the array of emitters forms a two-dimensional array, the formed beam can (in theory) be steered in two directions by applying a first constant phase difference between adjacent elements along a first axis and a second constant phase difference between adjacent elements along a perpendicular axis. Furthermore, the spot size formed by the beam at an arbitrary distance can be shown to be proportional to the array area.

In a number of embodiments, the phase shifters 306 are controlled by control circuitry (not show) and can be implemented using passive delay/phase elements and/or active phase shifters. In certain embodiments, p-n or p-i-n junction based phase shifters are utilized. In various embodiments, other types of phase shifters that can be controlled via control circuitry including (but not limited to) thermo-optic phase shifters, and/or MEMS based phase shifters can be utilized. In several embodiments, the optical antenna elements 308 are implemented using a grating coupler or an edge coupler. As can readily be appreciated, any of a variety of light sources, optical branches, optical phase shifters, and antenna elements appropriate to the requirements of specific applications can be utilized in the construction of OPAs in accordance with various embodiments of the invention. As noted above, calibration processes in accordance with various embodiments of the invention can be utilized to correct for nonlinearity in the phase response of individual branches in the OPA with respect to the phase controlling input.

Figure 4:
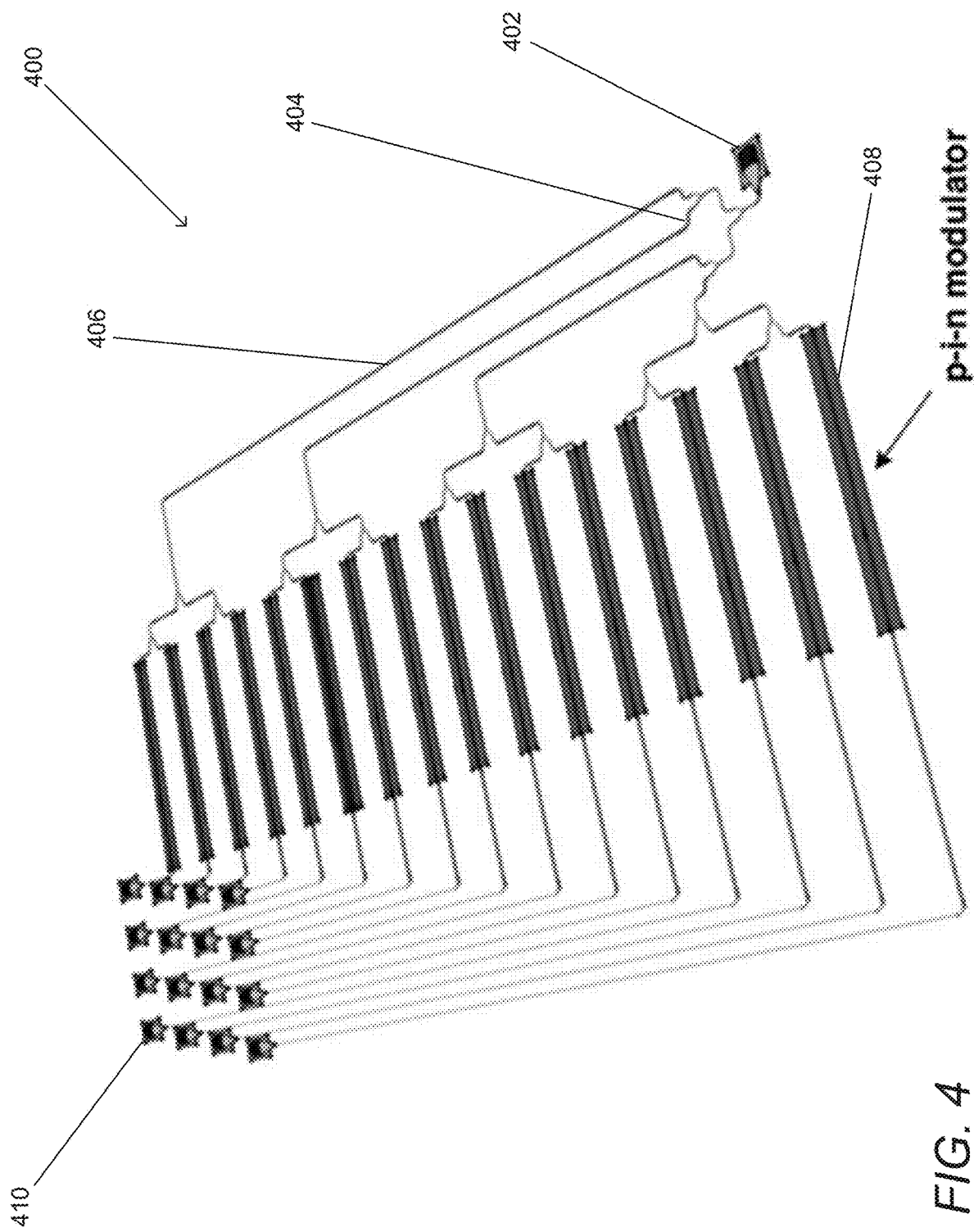
FIG. 4 illustrates an OPA TX that utilizes p-i-n modulators as phase shifters.

An OPA TX that utilizes p-i-n modulators as phase shifters in accordance with an embodiment of the invention is illustrated in FIG. 4. In the illustrated OPA TX 400, light can be coupled into an input grating coupler 402 through a single-mode optical fiber and then is guided to a Y-junction splitter network 404 through silicon nano-waveguides 406. The splitter network 404 can uniformly split and guide the coupled light into separate p-i-n phase modulators 408 in each branch. A p-i-n phase modulator 408 can be formed on a strip loaded optical waveguide that operates in forward bias. An advantage of using p-i-n phase modulators is that they enable fast beam steering. As can readily be appreciated, however, any of a variety of phase shifters can be utilized in the OPA as appropriate to the requirements of particular applications in accordance with various embodiments of the invention.

Figure 5:
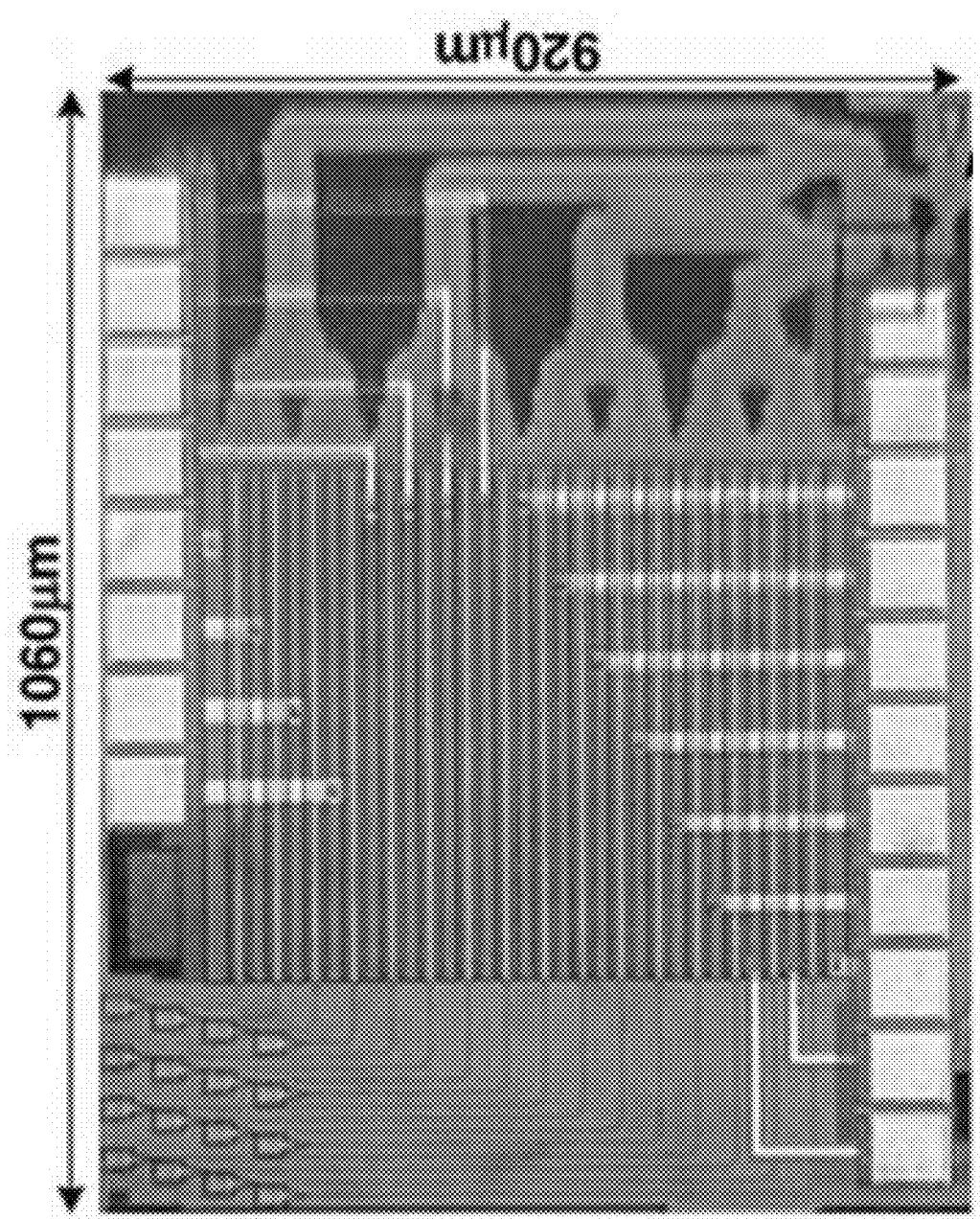
FIG. 5 is a photograph of an integrated circuit implementing an OPA TX similar to that shown in FIG. 4.

The phase modulated optical waves can then be guided to an antenna element 410 forming part of the radiating antenna array. In the illustrated embodiment, the radiating antenna elements 410 are grating couplers. As can readily be appreciated, any of a variety of antenna elements can be utilized as appropriate to the requirements of specific applications in accordance with various embodiments of the invention. FIG. 5 is a photograph of an integrated circuit implementing an OPA TX similar to that shown in FIG. 4.

Figure 6:
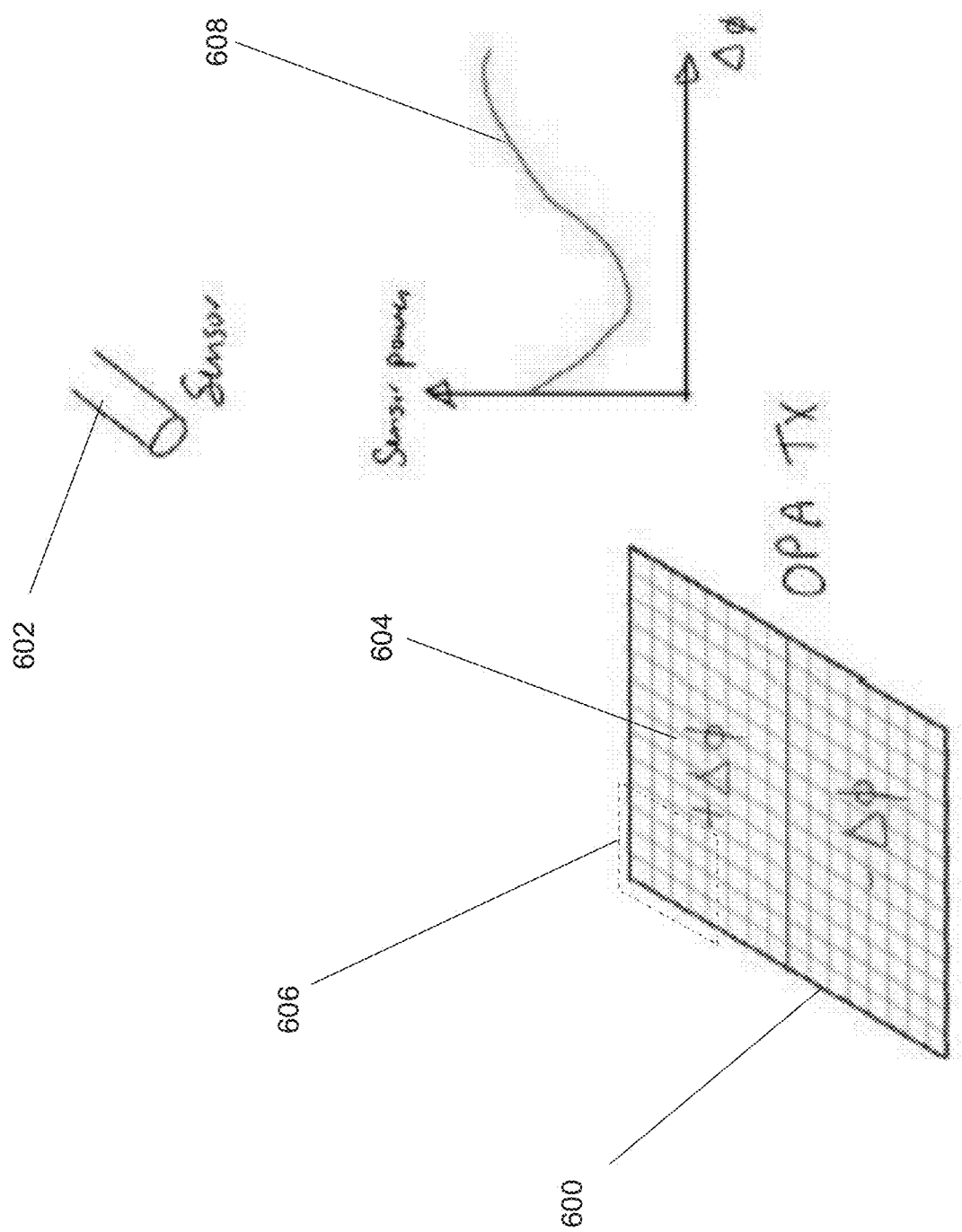
FIG. 6 conceptually illustrates the manner in which an OPX TX is calibrated in accordance with an embodiment of the invention.

The manner in which an OPX TX is calibrated in accordance with an embodiment of the invention is conceptually illustrated in FIG. 6. In the illustrated embodiment, the OPA TX 600 illuminates a sensor 602. The output of the sensor can serve as a calibration signal. In the illustrated embodiment, the sensor power can serve as the calibration signal. As is discussed above, a basis mask 604 can be utilized to perform phase sweeps of different segments 606 of the OPA 600 resulting in changes of the observed sensor power 608. By repeating the process using different basis masks, the solution space of phase states can be explored to identify an efficient and/or optimal phase state that can be utilized to perform beamforming using the OPA TX.

Figures 8A, 8B, 8C:
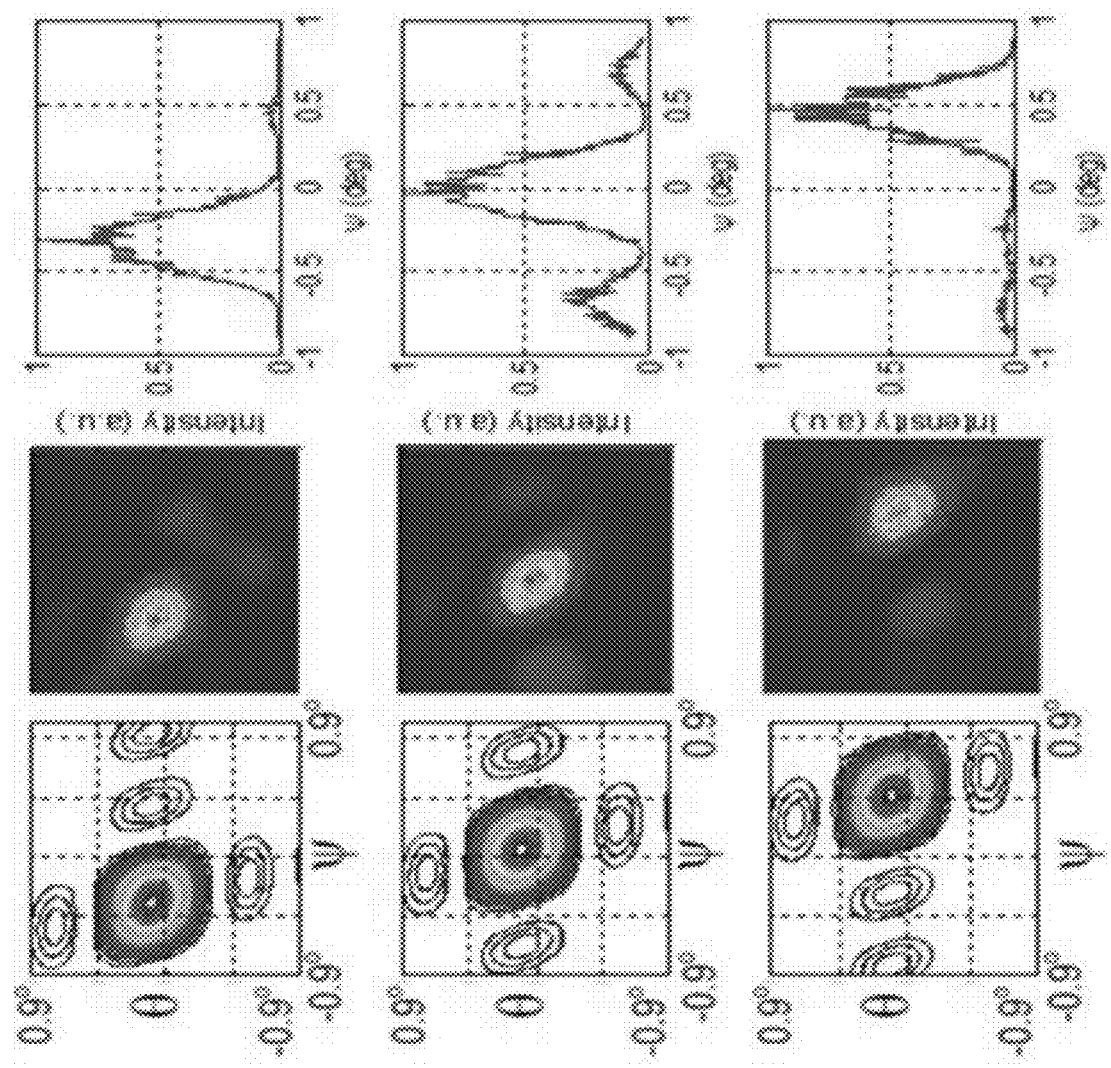
FIGS. 8A-8C show a comparison between measured horizontal beam spot movements and corresponding simulations.

The ability to perform reliable two-dimensional beamsteering using the OPA TX illustrated in FIG. 5, after calibration, is illustrated in FIGS. 7A-8C. Gradual beam steering in both vertical and horizontal directions is shown and compared with simulated patterns. As shown, the OPA TX is capable of two-dimensional beamsteering over full vertical and horizontal lobe spacing periods. FIGS. 7A-7B show that the measured vertical beam spot movements are in close agreement with the corresponding simulations. FIG. 7C shows the cross-section of the measured far-field pattern of the OPA. Similarly, FIGS. 8A-8C show the horizontal beam spot movements. Note that the vertical beamsteering has some small horizontal shift due to the parallelogram lattice structure of the array of FIG. 5.

While specific OPA TXs are described above with reference to FIGS. 3-8C, the calibration processes described herein can be utilized in any of a variety of OPA TXs including (but not limited to those) described above and with respect to OPA TXs incorporating any of a variety of phase shifters and/or control mechanisms and/or configured to perform a variety of functions including (but not limited to) beamforming, focusing, and/or other waveform manipulation and control functions. In addition, calibration processes can also be used in a similar manner with OPA RXs. A variety of OPA RX architectures that can be calibrated using calibration processes in accordance with various embodiments of the invention are discussed further below.

OPA RXs

Figure 9:
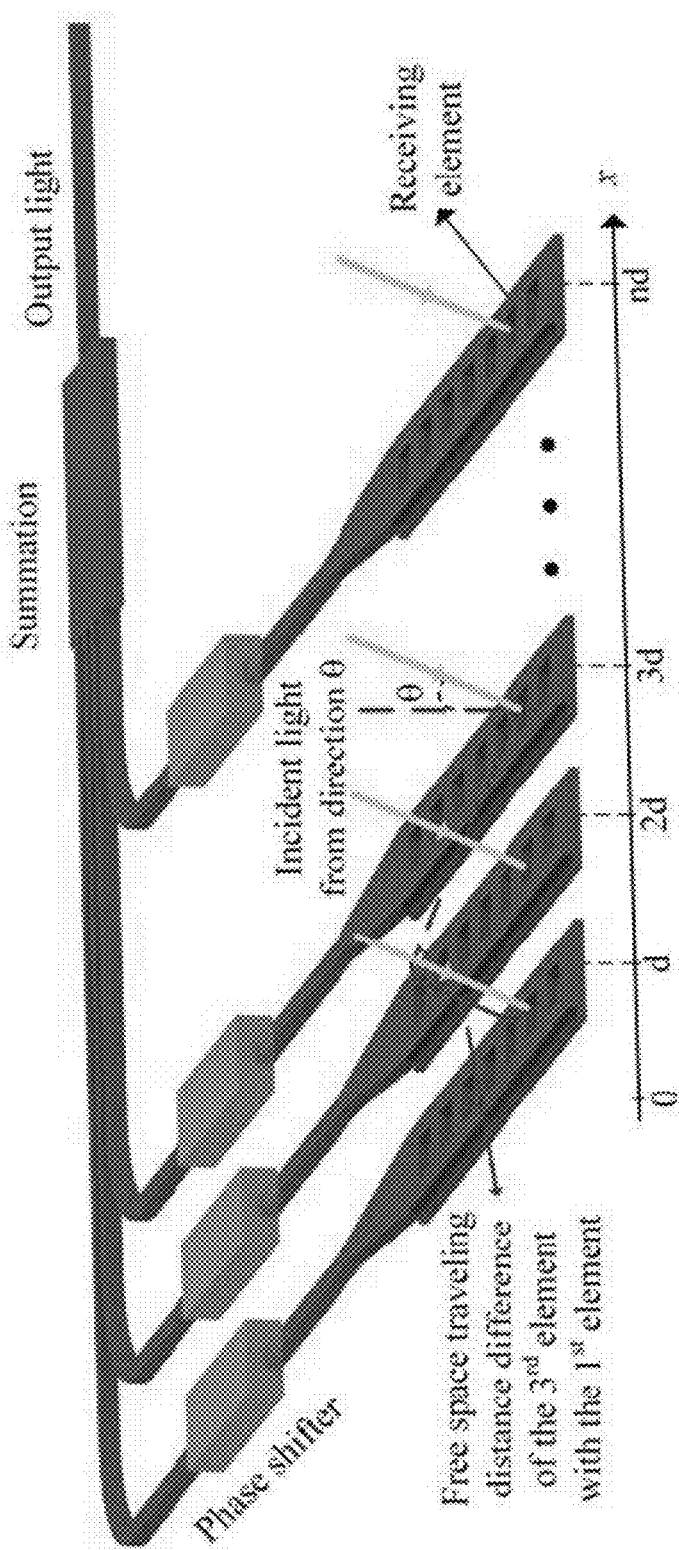
FIG. 9 shows an OPA RX implemented to receive incident light at an array of antenna elements.

Since electromagnetic wave propagation is reciprocal, in principle, a similar array structure to that utilized in an OPA TX can detect and determine light intensity arriving from a particular angle. Accordingly, OPA RXs can be implemented that receive incident light at an array of antenna elements as conceptually illustrated in FIG. 9. The main challenge faced by OPA RXs is that the optical signal received at each element is typically very weak. Therefore, directly using an OPA TX architecture as a receiver (as the reciprocity principle suggests) is not necessarily the most efficient implementation of an OPA RX. In such a direct conversion OPA RX, the weak received signal is likely to be further attenuated by the phase shifters in the signal path, degrading performance. Therefore, OPA RXs are often implemented using similar components, but with a slightly different architectures to increase sensitivity. One such architecture is the OPA RX architecture that incorporates heterodyne detection described in Abiri, Behrooz, Reza Fatemi, and Ali Hajimiri. "A 1-D heterodyne lens-free optical phased array camera with reference phase shifting." *IEEE Photonics Journal* 10, no. 5 (2018): 1-12, the disclosure of which including the disclosure regarding the construction of OPX RXs that utilize heterodyne detection is incorporated herein by reference in its entirety. As can readily be appreciated, calibration processes in accordance with various embodiments of the invention can be utilized in any of a variety of optical systems that utilize phase shifters in combination with an array of optical elements that couple light into the optical system as appropriate to the requirements of specific applications.

Figure 10:
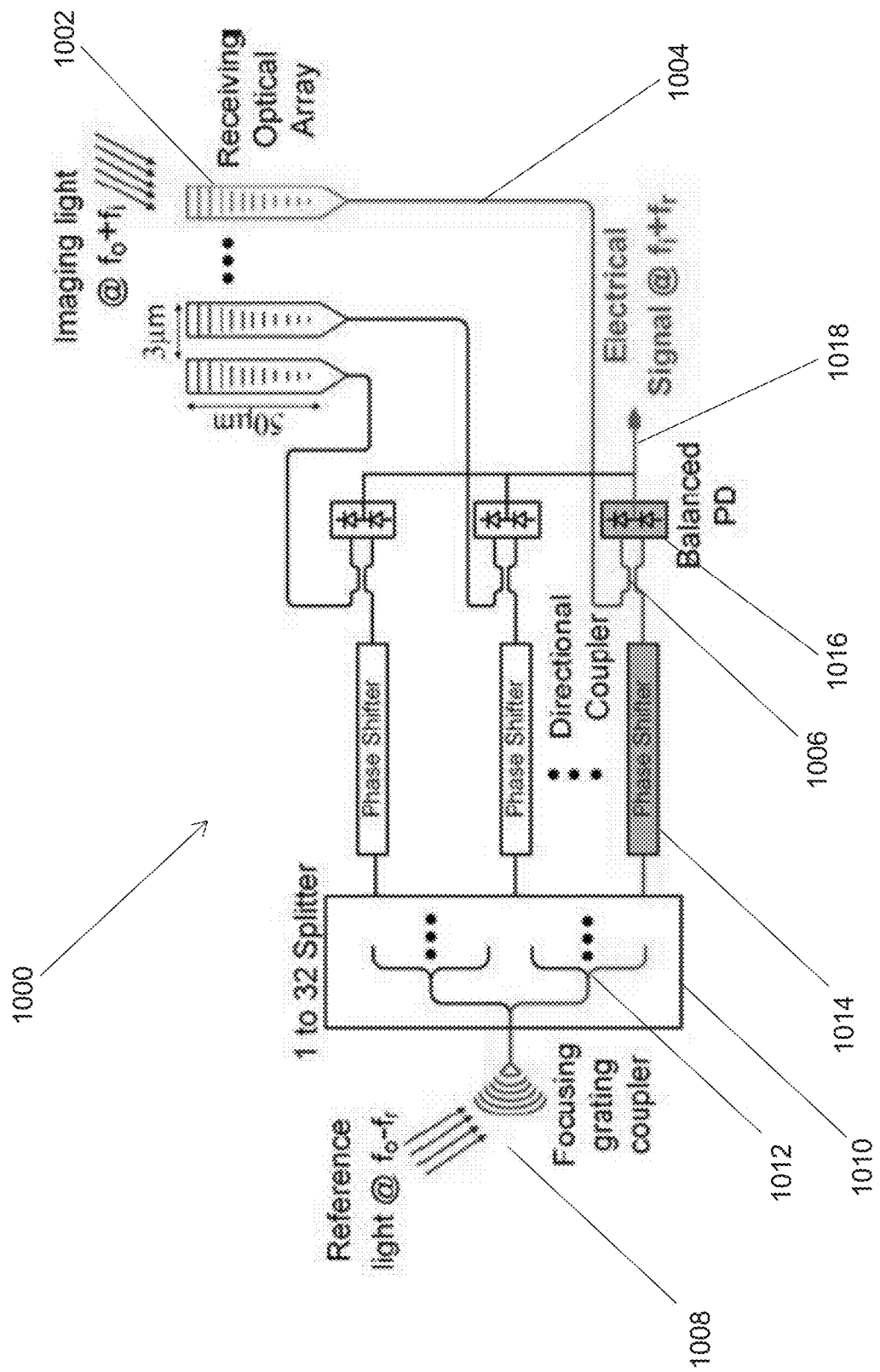
FIG. 10 schematically illustrates a 1D OPA RX architecture including heterodyne detection that can be utilized in accordance with an embodiment of the invention.

A 1D OPA RX architecture including heterodyne detection that can be utilized in accordance with an embodiment of the invention is schematically illustrated in FIG. 10. The OPA RX 1000 includes an array of optical elements 1002. In the illustrated embodiment, the array is a 1D array. As can readily be appreciated, the optical array can include a 2D array of elements positioned in regular or irregular arrangements.

Incident light is coupled into optical branches 1004 by the optical elements 1002. A directional coupler 1006 in each branch is used to perform heterodyne mixing of the received optical signal with a reference signal. The heterodyne mixing process can increase the sensitivity of the OPA RX, because the received optical signal is amplified by a gain factor proportional to the amplitude of the stronger reference signal.

Traditional receive beamforming processes involve phase shifting the received signal. Due to signal losses in the phase shifters, the illustrated OPA RX instead phase shifts the reference signal. Phase shifting of the reference signal is achieved by feeding a reference light source 1008 to an optical splitter 1010 network. In the illustrated embodiment, the splitter network 1010 is a Y-junction 1012 splitter network. In this way, a separate reference signal is available to each optical branch of the OPA. The reference signal is provided to a phase shifter 1014, which applies a phase shift to the reference signal prior to heterodyning mixing with the received optical signal in the directional coupler 1006. The outputs of the directional coupler 1006 are provided to balanced photodiodes 1016 to produce an electrical output signal. The signals from each of the balanced photodiode pairs 1016 can be utilized to produce an OPA RX output 1018.

Figure 11:
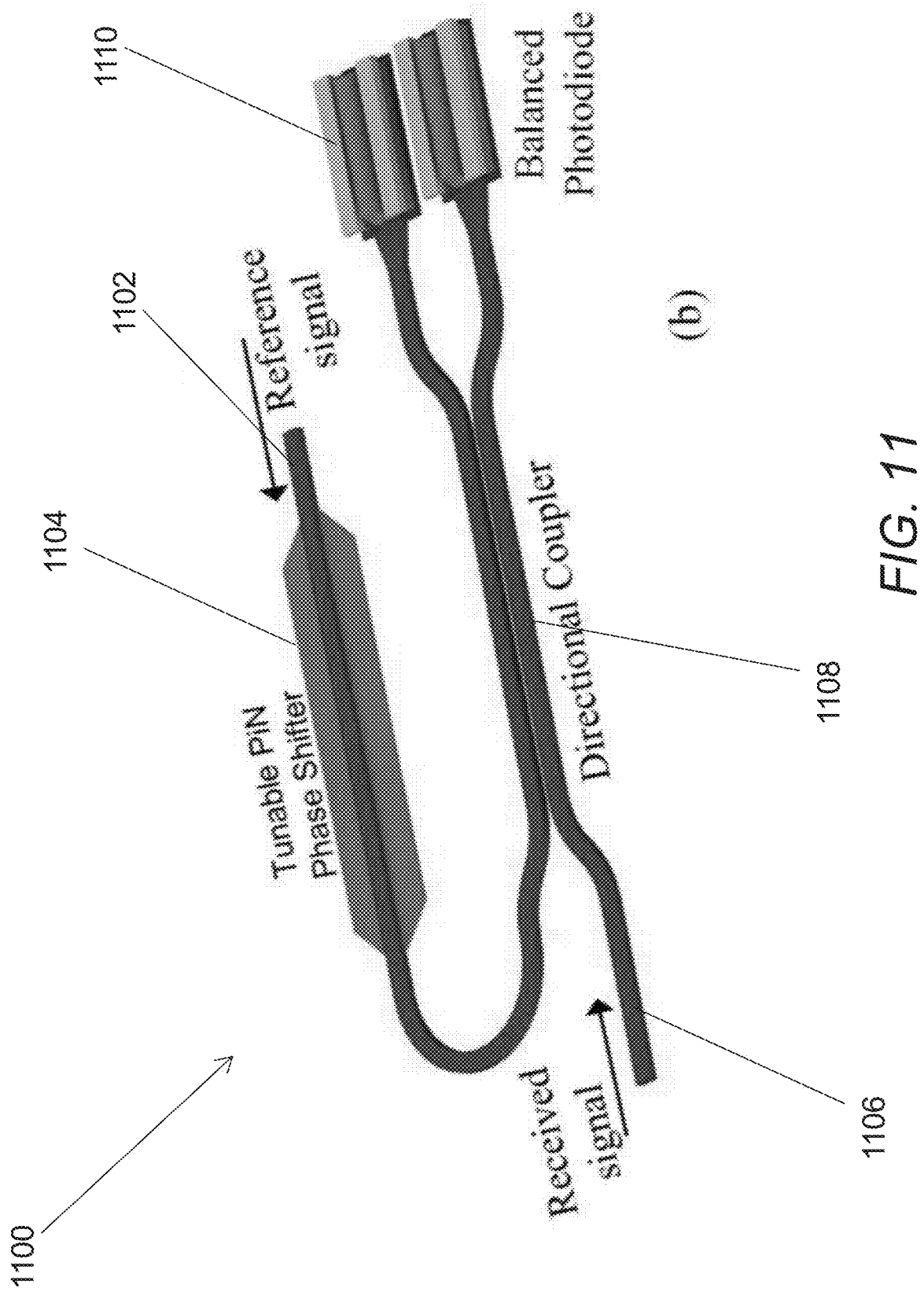
FIG. 11 illustrates the manner in which heterodyne mixing and detection can be performed within an OPA.

The manner in which heterodyne mixing and detection can be performed within an OPA is illustrated in greater detail in FIG. 11. The optical heterodyne detector 1100 receives a reference signal by a reference optical channel 1102. The reference signal is phase shifted using a p-i-n phase modulator 1104 that can be controlled by electrical signals provided by control circuitry (not shown). The phase shifted reference signal output by the phase shifter and the received optical signal from a received optical signal branch 1106 are fed into a directional coupler 1108 that performs optical heterodyne mixing. The two mixed signals output by the directional coupler 1108 are then provided to a pair of balanced photodiodes 1110.

Figure 12:
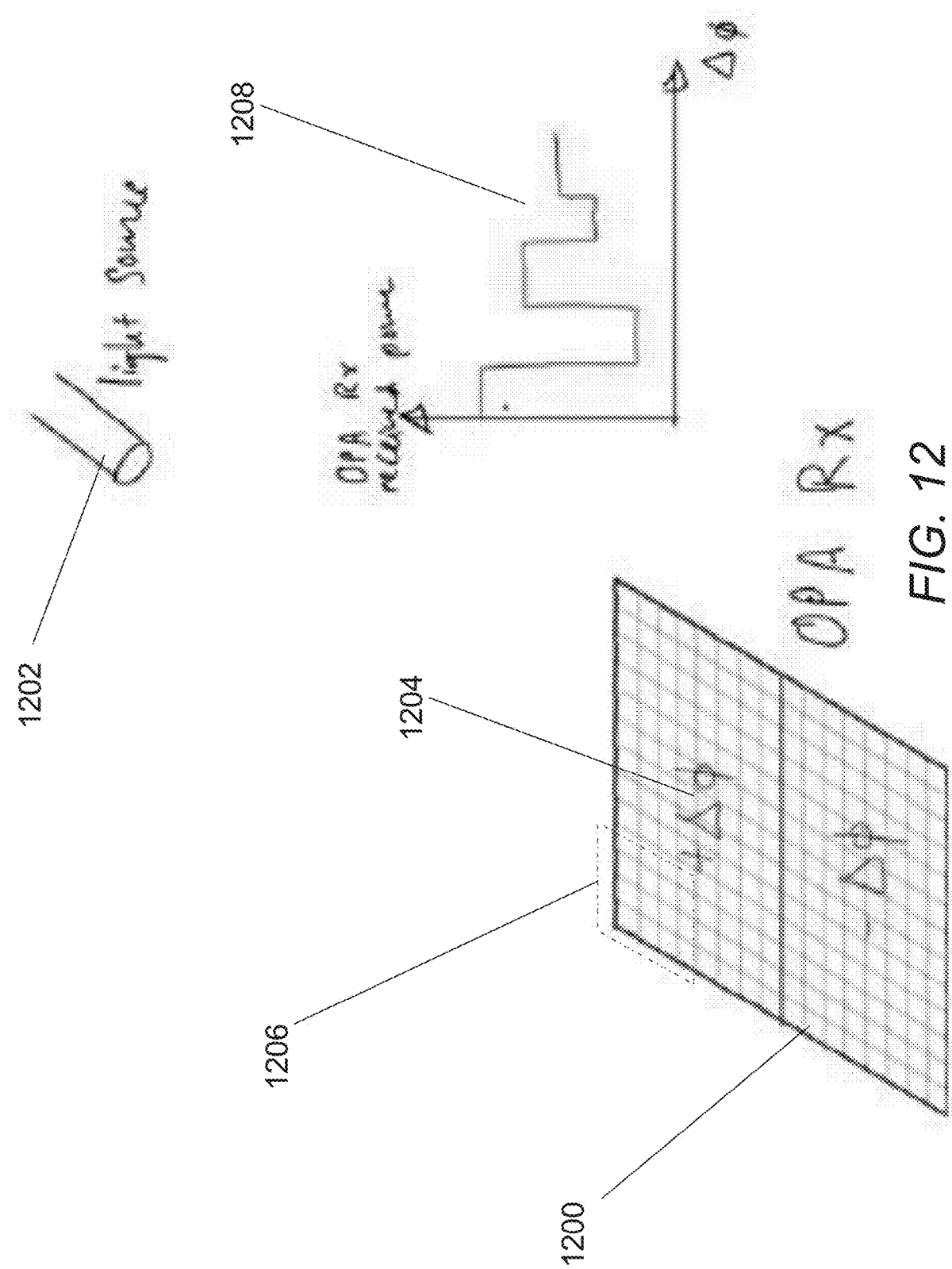
FIG. 12 conceptually illustrates the manner in which an OPA RX can be calibrated.

The manner in which an OPA RX can be calibrated is conceptually illustrated in FIG. 12. In the illustrated embodiment, the OPA RX 1200 includes a 2D OPA that is illuminated by a well characterized light source 1202. The output power of the OPA RX can serve as a calibration signal. In the illustrated embodiment, the OPA RX received power can serve as the calibration signal. As is discussed above, a basis mask 1204 can be utilized to perform phase sweeps of different segments 1206 of the OPA 1200 resulting in changes of the observed sensor power 1208. By repeating the process using different basis masks, the solution space of phase states can be explored to identify an effective and/or optimal phase state that can be utilized to perform functions including (but not limited to) receive beamforming using the OPA RX.

While specific OPAs are described above with reference to FIGS. 3-12, OPAs in accordance with various embodiment of the invention can be constructed using any components and/or fabrication processes that can be utilized in the construction of an OPA. As stated above, calibration processes in accordance with various embodiments of the invention can be utilized to ascertain phase calibration state information for phase shifters in OPAs irrespective of whether the OPA is an OPX TX or OPX RX and/or the specific architecture employed within the OPA. Specific calibration processes that can be utilized to determine phase state calibration information for systems including (but not limited to) optical systems that include OPAs and techniques for generating basis masks in accordance with certain embodiments of the invention as discussed further below.

Calibration Processes Using Basis Masks

Referring again to FIG. 2, a high-level process 200 is shown for determining phase state calibration information in a system including an array such as (but not limited to) any of the OPA TX and OPA RX systems described above. A key feature of calibration processes in accordance with many embodiments of the invention is performing coordinated phase sweeps of groups of phase shifters. Basis masks can be utilized to determine the phase sweeps applied to individual phase shifters at different stages during the calibration process. As is discussed in more detail below, the characteristics of the basis mask can determine how likely a calibration process is to identify an optimal or desired phase state and/or the speed with which such a phase state can be identified by the calibration process.

Basis Masks

The phase and amplitude settings of an N-element array can be considered to be a complex N-dimensional basis for a vector space of the element settings. If only phases were to be varied, the vector space will be real and corresponds to all of the potential phase states of the array. The vector space of the phase state space of the array can be spanned using different sets of basis functions. Many embodiments of the invention utilize an incomplete set of basis functions (i.e. a set of basis functions that do not span the entire phase state space). In certain applications, however, mutually independent basis functions are utilized that enable evaluation of the entire phase state space of the array. As is discussed further below, basis masks can be generated using a set of basis functions. While much of the discussion that follows relates to the generation of basis masks for OPAs that incorporate regular two-dimensional arrays of optical elements, it is important to appreciate that basis masks can be generated and applied during calibration processes in any of a variety of systems in accordance with various embodiments of the invention and to any arbitrary arrangement of N elements including (but not limited to) one dimensional arrays, and sparse arrays.

Figure 13:
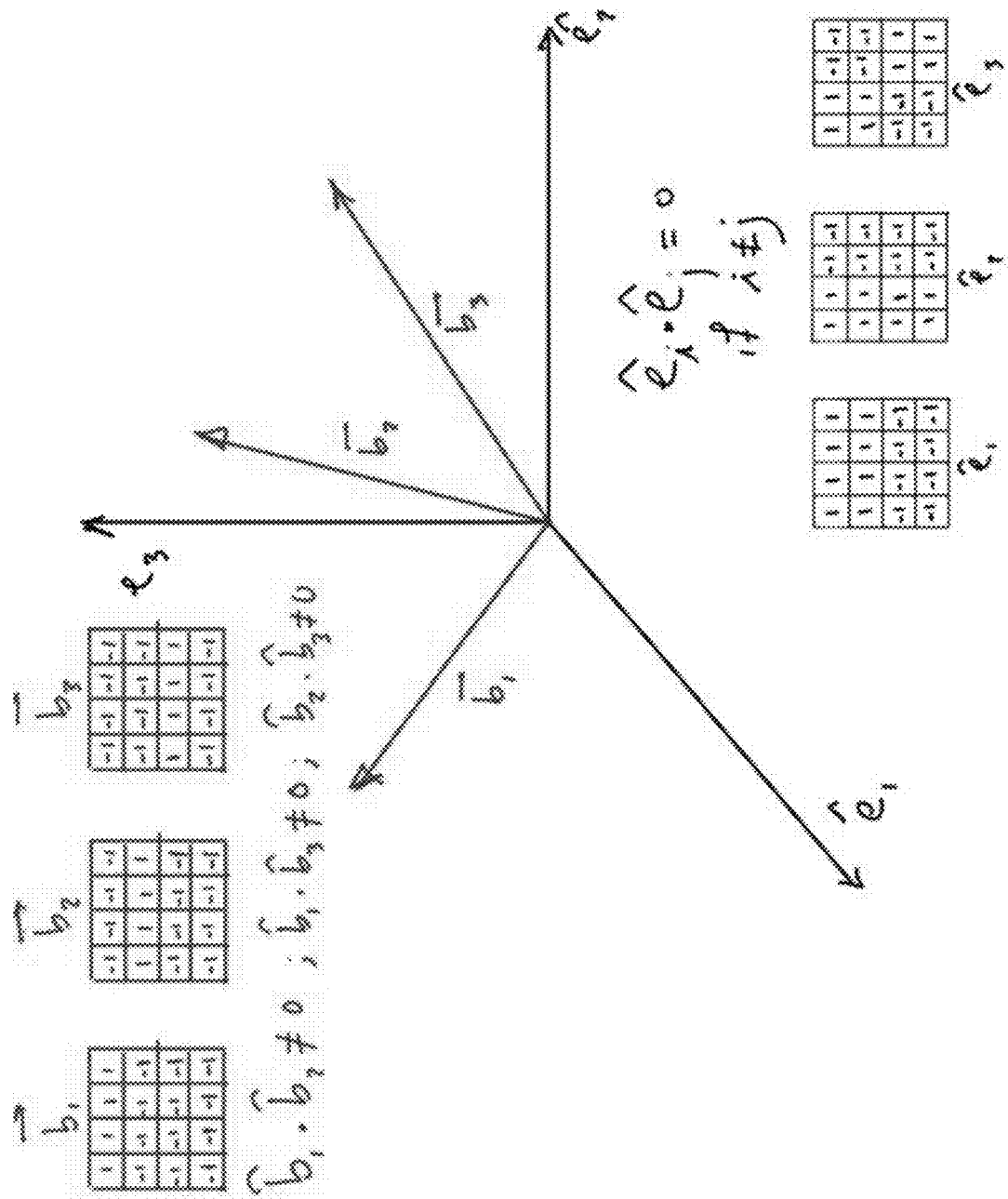
FIG. 13 conceptually illustrates an example of the manner in which basis functions can be utilized to generate basis masks in accordance with an embodiment of the invention.

A simple example of the manner in which basis functions can be utilized to generate basis masks is conceptually presented in FIG. 13. Three independent basis masks, $\vec{b}_1, \vec{b}_2$ and $\vec{b}_3$ are illustrated. It is noteworthy that the exemplary basis, b, is not orthogonal. In this context, orthogonality is defined as the inner product of two masks being zero. The inner product of masks a and b is defined as:

$$a.b = \sum_i \sum_j a_{ij} b_{ij}$$

with elements at −1 and 1 in this example. As noted above, masks are not limited to elements of −1 and 1, but can include any values appropriate to the requirements of a particular application.

There are additional benefits to using an orthogonal basis (or nearly orthogonal ones) to span the phase state space of a particular OPA. An example of three orthogonal masks is also shown in FIG. 13, where 2-dimensional basis functions $\hat{e}_1, \hat{e}_2$ and $\hat{e}_3$ are orthogonal. The dimensionality of the phase state space is N, meaning that N basis vectors are needed to completely span the space. Although it is possible and certainly not excluded in this disclosure to use an incomplete basis, there are benefits to a complete basis that spans the entire vector space of optimization parameters. As an incomplete basis could result in suboptimal focusing and thereby degrade optical beam quality. This is because parts of the design space would remain unexplored. Various basis functions are possible, however different basis functions are often preferred depending on the optimization scenario. For example, a large dynamic range can be generated in the case of a noisy and weak signal by selecting a set of basis functions that vary the phase of a large number of phase shifters during a phase sweep. The upper bound for this is varying the phase of half of the elements with respect to the other half, which produces the maximum dynamic range with the phase sweep. Such large variations, resulting from multiple element fluctuations can provide a large dynamic range that is useful in assessment of the preferred phase settings in both cases of OPA TXs or OPA RXs.

One exemplary embodiment of the use of basis masks involves sweeping the phase of one group of elements (designated by color red in FIG. 6 for an OP TX) relative to the other elements (for instance, the blue) for each of the 2-dimensional basis masks. In many embodiments, the phase shift may be done differentially (with one group moving in the opposite direction of the other group) (masks with element at +1 or −1, which can be referred to as signed masks), or in a one-sided fashion, where only one group of phases are swept without the other group moving (with mask elements at 0 or 1 hereafter referred to as binary masks).

Orthogonal Basis Masks

As mentioned above, there are certain benefits to using masks that are substantially orthogonal. One of those advantages is the smaller projection of optimization of phase sweeps using a first mask compared to phase sweeps using the other masks (theoretically zero for a perfectly orthogonal basis). Furthermore, the use of orthogonal basis masks can enable identification of an optimal calibration phase state to be done in batch without the need for frequent updates to each element's phase setting, which can significantly reduce the number of communication updates between an OPA and an OPA controller. The orthogonality can help minimize the effects of nonidealities (including but not limited to coupling, thermal cross-talk, and phase shifter nonlinear response) in the aggregate sum and enable the superposition of the optimal phase shifts for each mask to provide a close approximation of the optimum phase shift across the aggregate masks. As such perfect orthogonality is not necessary and quasi-orthogonal or nearly orthogonal masks can also provide a useful result. This would correspond to masks whose inner products are not exactly zero, but still smaller (to varying degrees) than the inner product of the mask with itself.

Generating Complete Mask Sets

Figure 14:
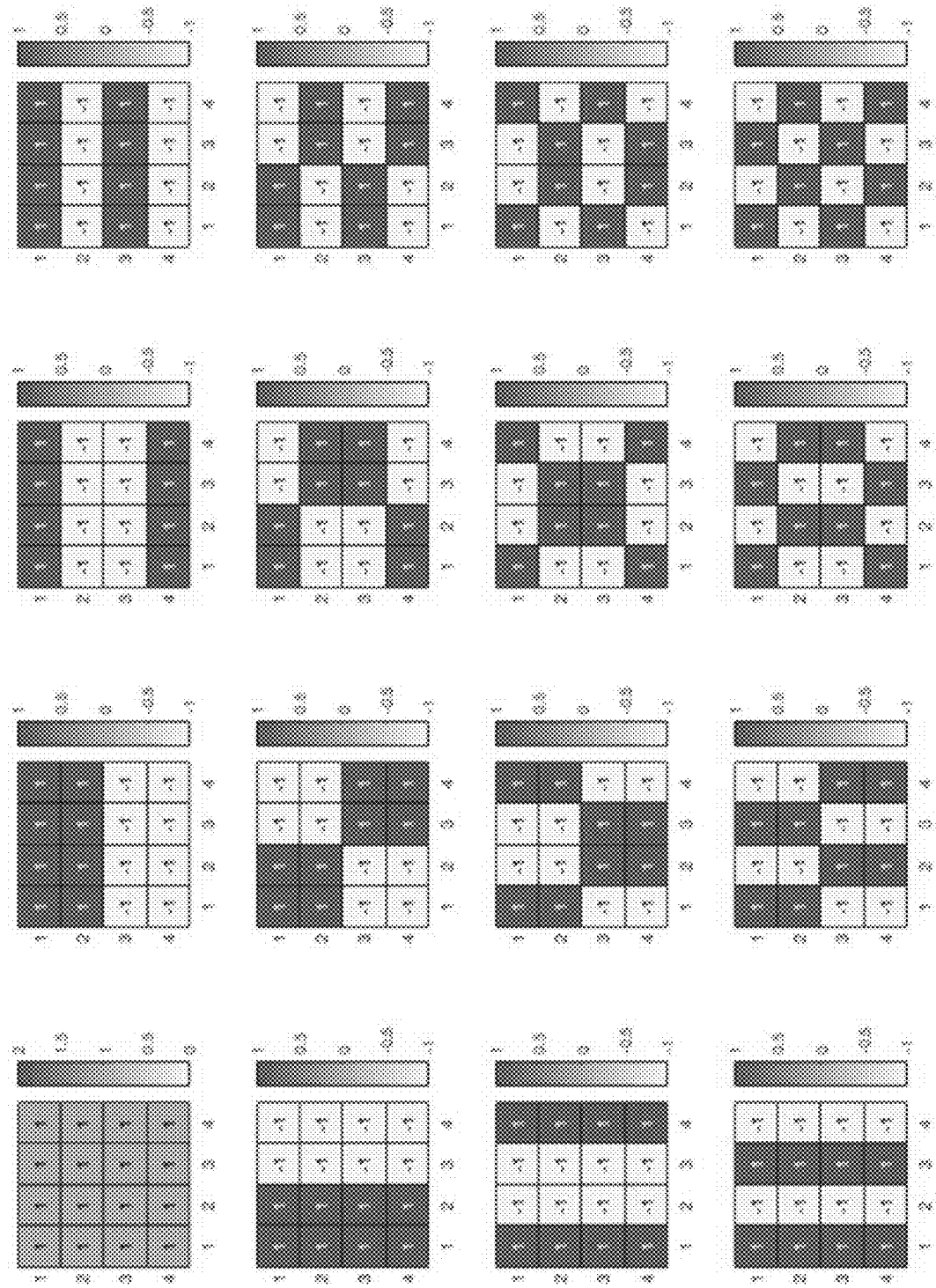
FIG. 14 illustrates a complete and orthogonal mask set for a 4×4 array.

Using a complete mask set can enable a calibration process in accordance with an embodiment of the invention to get closer to the target optimization point with no blind spots in the optimization space. One such exemplary complete and orthogonal mask set is shown in FIG. 14 for a 4×4 array. Even if a random selection of elements were to be phase swept at the same time, the system would be prone to incompleteness in such an approach, meaning certain states or combinations of them can be missed, often resulting in (substantially) suboptimal performance. It should be emphasized that calibration processes in accordance with many embodiments of the invention use incomplete, or non-orthogonal masks for any specific applications. As can readily be appreciated, the specific characteristics of the mask sets that are utilized in a particular calibration process in accordance with various embodiments of the invention are largely dependent upon the requirements of practical applications.

The exemplary mask-set of FIG. 14 can be generated using two Hadamard matrices. In general, a perfectly orthogonal basis mask set of size M×N can be generated using Hadamard matrices of size M×M and N×N. The orthogonal basis mask set can be constructed either analytically or by computers. The Hadamard matrices used to generate the 2-dimensional mask set of size 4×4 can be one and the same, because M=N=4. The Hadamard Matrix (with rows reordered) is:

$$H_4 = \begin{bmatrix} 1 & 1 & 1 & 1 \\ 1 & 1 & -1 & -1 \\ 1 & -1 & -1 & 1 \\ 1 & -1 & 1 & -1 \end{bmatrix}$$

The individual masks are generated by preforming matrix multiplication of a column of the M×M matrix by a row of the N×N matrix to generate a mask of size M×N.

Generating Quasi-Orthogonal Masks

Figure 15:
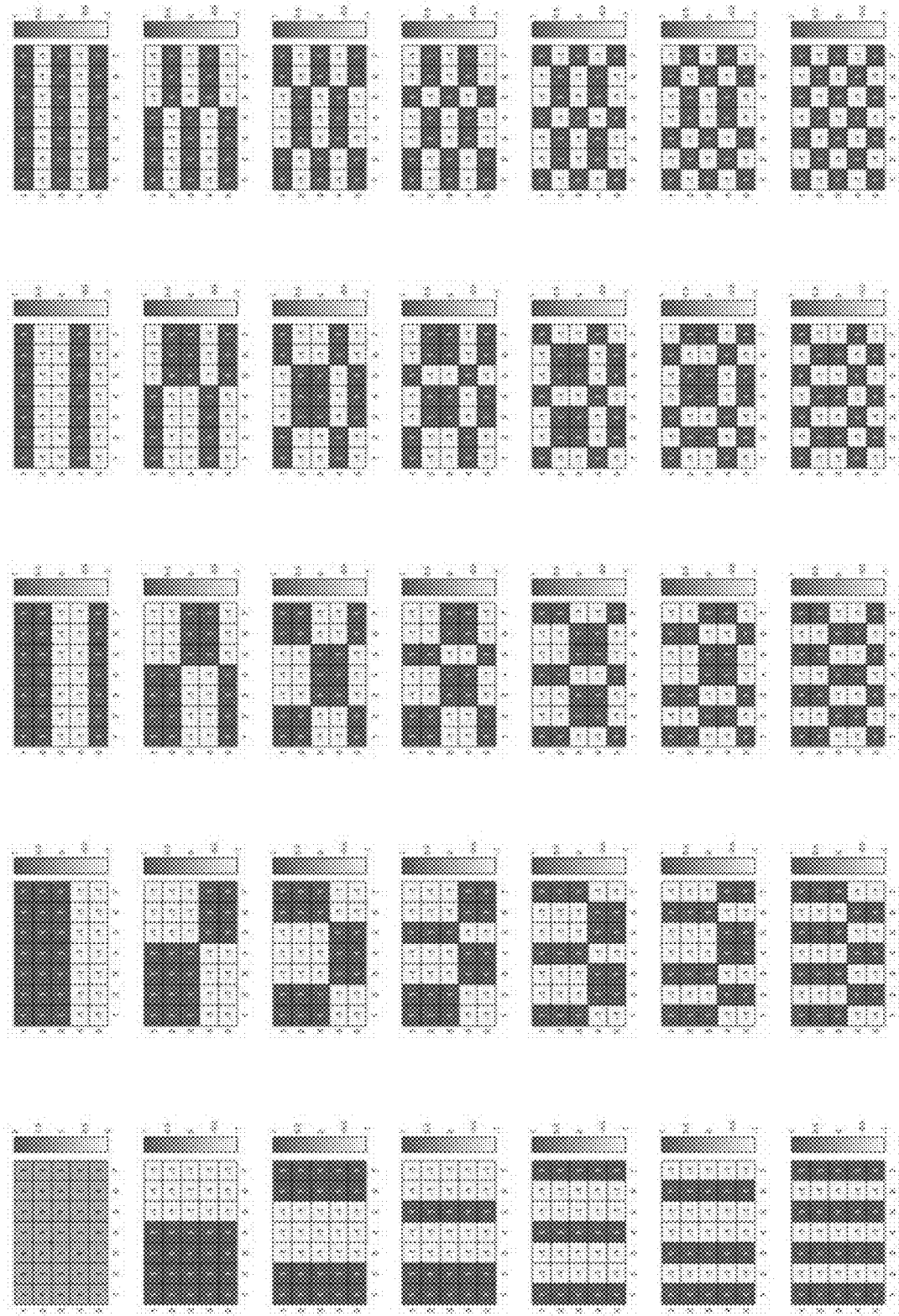
FIG. 15 illustrates a mask set for a 5×7 array.

The two matrices used do not have to be the same size or for that matter perfectly orthogonal. An example of this is shown in FIG. 15 for masks of size 5×7. In this example, what can be referred to as a quasi-orthogonal basis is utilized. This can be generated using what can be referred to as pseudo-Hadamard matrices. The basis B is close to orthogonal if the product of $B.B^T$ is close to N×M.I, where I is the identity matrix. Namely, the nondiagonal elements of the product of $B.B^T$ should be much smaller than the diagonal. Quasi-orthogonal mask sets can be implemented as elements of 1 and −1, or 0 and 1 (with an XOR operation) or any other sets of values including signed integers, real numbers, complex numbers, to name a few possibilities.

Using orthogonal or quasi-orthogonal masks facilitates evaluation of the optimum phases for multiple masks independently and sequentially without the need to update the OPA phase settings after each phase sweep of the active radiators under the active mask. This can be particularly useful in the presence of latency or speed limitations for communications. The orthogonal and quasi-orthogonal masks allow the phase sweeps to be done independently and the aggregate result effectuated after a predefined number of masks have gone through the phase sweep.

Performing Phase Sweeps Using Basis Masks

As is discussed above, each of the basis masks defines different sets of phase shifters to which a phase sweep is applied leading to received power variation at a calibration sensor for the case of an OPA TX (as in FIG. 6) or received power variation in the case of an OPA RX illuminated by a calibration light source (as in FIG. 12). In each case, the relevant calibration signal can be monitored as the phase is swept and utilized to select a calibration phase state for use in subsequent beamforming and/or beam steering. In several embodiments, the phase of the elements within each mask can be swept over an arbitrary number of steps and over different total phase sweep ranges (PSR) within different overall iterations of a calibration loop. The number of phase steps (NPS) evaluated can be as low as two with no upper bound. A smaller number of phase steps (i.e., large phase step increments) can produce a smaller number of calibration signal measurements to be evaluated, which can result in a higher speed of operation and lower complexity in the detection. A smaller PSR can result in a subsection of the phase sweep range of a particular optical element being explored. In many embodiments, reductions in the PSR can occur in the later stages of the optimization, where the calibration process (through its automated operation) effectively performs fine tuning of the phase settings.

The mask sets do not need to be applied to the full size of the OPA. In a number of embodiments, the array is broken down into smaller segments, where within each segment the appropriate set of masks (possibly, but not necessarily, orthogonal or quasi-orthogonal) determines the manner in which phase sweeps are applied to particular phase shifters. The size and the number of the masks associated with each segment is smaller than the number of masks that ideally are required to identify an optimal phase state for the entire OPA. For example, segments of size $M_s \times N_s$ can be calibrating using $M_s \times N_s$, masks per segment. This will result in smaller number of elements phase swept at any given time and fewer masks to sweep through during the calibration process. In this way, sweeps can be performed faster, but at the potential cost of lower phase variation dynamic range. This trade-off can be explored and utilized over the iterations (or recursions) of a calibration process in accordance with an embodiment of the invention by using different segmentation parameters.

In one exemplary embodiment, the optimum phase setting for each mask within each segment is shown as $\Delta c_{opt}(i)$. This corresponds to the setting for the phase shifters within the OPA (for example, a thermal or PIN phase shifter) that produced the largest calibration signal under the ith segment mask, M(i), at a sensor in the case of an OPA TX or at an OPA RXs detection port. A new phase state setting associated with the new optimum phases can be determined using the following:

$$\Delta C = \mathrm{mod}\left(\sum_{i=1}^{M_s \times N_s} \Delta c_{opt}(i) M(i), P\right)$$

where matrix P captures the local period of the phase shift in units of the phase shifter code for individual phase shifters (e.g., the phase shifter settings of the individual array elements.)

In several embodiments, the overall calibration process involves one or multiple iterations of a process of performing phase sweeps using a set of masks with respect to each segment in an array. The loop can start from a random initial state or use previously evaluated phase settings as a starting point to provide faster convergence to the optimum phase setting. In each iteration, the phase sweep range (PSR), the number of phase steps (NPS), and the segmentation sizes ($M_s \times N_s$) can change. In many embodiments, smaller segment sizes can be used in the early iterations in combination with a relatively larger PSR. This is where due to large changes in the phase of elements with respect to each other a large change in the received power in the calibration signal can be observed and the larger dynamic range allows for a smaller number of elements to be changed in each step (smaller segment sizes). In a number of embodiments, as the main loop progresses, and the coarse phase tuning transitions toward finer tuning (smaller PSR), the variation in the amplitude becomes smaller and larger segmentations (potentially up to full array size) can be utilized as the larger number of elements can generate larger power in the calibration signal despite the smaller PSR.

An example of pseudocode that can be used to implement a calibration process in accordance with an embodiment of the invention is provided in FIG. 16. While specific calibration processes and sequences of iterations are described above, any of a variety of calibration processes that apply phase sweeps to groups of phase shifters in a coordinated manner to achieve variations in a calibration signal above the noise floor of the system can be utilized as appropriate to the requirements of specific applications in accordance with various embodiments of the invention. Furthermore, while the calibration processes described herein are discussed in the context of optical phased array (OPA) transmitters and receivers, similar calibration processes can also be utilized in other types of optical arrays and sensors, where elements working in concert need to be optimized in terms of their phase and/or amplitude settings.

Although the present invention has been described in certain specific aspects, many additional modifications and variations would be apparent to those skilled in the art. It is therefore to be understood that the present invention may be practiced otherwise than specifically described, including various changes in the implementation other than those described herein such as (but not limited to) multiple element phased arrays for communication and sensing, sensors arrays, multiply static sensors, multiple array projection system, and/or holographic systems at various wavelengths of the electromagnetic spectrum, without departing from the scope and spirit of the present invention. Thus, embodiments of the present invention should be considered in all respects as illustrative and not restrictive.

What is claimed is:

1. An optical system, comprising:
an optical phase array (OPA) comprising a plurality of branches that are each connected to optical elements and each include a phase shifter, where each phase shifter is controllable via control circuitry;
an OPA controller configured to generate control signals to control the phase of the phase shifters in the OPA via the control circuitry;
wherein the OPA controller is further configured to perform a calibration process comprising:
sending control signals to the OPA control circuitry to perform a plurality of phase sweeps using each of a plurality of different basis masks, where each phase sweep comprises:
performing a phase sweep across a phase sweep range at a plurality of phase step increments with respect to a first group of phase shifters identified in a basis mask, where the first group of phase shifters comprises a plurality of phase shifters; and
measuring a calibration signal at each of the plurality of phase step increments during the phase sweep; and
generating calibration phase state information based upon the measured calibration signals.

2. The optical system of claim 1, wherein the OPA controller is configured to perform beamforming using the OPA by sending control signals to the OPA control circuitry based upon the calibration phase state information.

3. The optical system of claim 1, where each phase sweep further comprises maintaining the phase offset of a second group of phase shifters identified in the basis mask during the phase sweep, where the second group of phase shifters does not include any of the phase shifters from the first group.

4. The optical system of claim 1, where each phase sweep further comprises simultaneously performing an opposite phase sweep across the phase sweep range at a plurality of negative phase step increments with respect to a second group of phase shifters identified in the basis mask, where the second group of phase shifters does not include any of the phase shifters from the first group.

5. The optical system of claim 1, wherein the size of the basis masks from the plurality of different basis masks changes between at least some of the plurality of phase sweeps.

6. The optical system of claim 5, wherein the size of the basis masks increases between at least some of the plurality of phase sweeps.

7. The optical system of claim 5, wherein the phase sweep range changes between at least some of the plurality of phase sweeps.

8. The optical system of claim 7, wherein over the course of the plurality of phase sweeps:
the size of the basis masks increases; and
the size of the phase sweep range decreases.

9. The optical system of claim 5, wherein the phase step increment changes between at least some of the plurality of phase sweeps.

10. The optical system of claim 9, wherein over the course of the plurality of phase sweeps:
the size of the basis masks increases;
the size of the phase sweep range decreases; and
the size of the phase step increment decreases.

11. The optical system of claim 1, wherein the phase sweep range changes between at least some of the plurality of phase sweeps.

12. The optical system of claim 1, wherein the phase step increment changes between at least some of the plurality of phase sweeps.

13. The optical system of claim 1, wherein the plurality of different basis masks comprises a set of basis masks that are orthogonal.

14. The optical system of claim 1, wherein the plurality of different basis masks comprises a set of basis masks that are nearly orthogonal.

15. The optical system of claim 1, wherein the OPA is configured as an OPA transmitter.

16. The optical system of claim 15, wherein:
the OPA transmitter further comprises an input into which an optical input can be coupled and a splitter network;
each phase shifter is configured to receive the optical input from the splitter network and apply a phase shift to the received optical input; and
the optical elements are radiating antenna elements that form a radiating antenna array.

17. The optical system of claim 1, wherein the OPA is configured as an OPA receiver.

18. The optical system of claim 17, wherein:
each optical element is configured to couple incident light into the optical branch to which it is connected;
the optical branch comprises a directional coupler configured to perform heterodyne mixing of a received optical signal with a reference signal; and
the phase shifter is configured to apply a phase shift to the reference signal.

19. An optical system, comprising:
an optical phase array (OPA) comprising a plurality of branches that are each connected to separate optical elements and each include a phase shifter, where each phase shifter is controllable via control circuitry;
an OPA controller configured to generate control signals to control the phase of the phase shifters in the OPA via the control circuitry;
wherein the OPA controller is further configured to perform a calibration process comprising:
sending control signals to the OPA control circuitry to perform a plurality of phase sweeps using each of a plurality of different basis masks, where each phase sweep comprises:
performing a phase sweep across a phase sweep range at a plurality of phase step increments with respect to a first group of phase shifters identified in a basis mask, where the first group of phase shifters comprises a plurality of phase shifters; and measuring a calibration signal at each of the plurality of phase step increments during the phase sweep; and generating calibration phase state information based upon the measured calibration signals;

wherein the size of the basis masks from the plurality of different basis masks changes between at least some of the plurality of phase sweeps;

wherein the phase sweep range changes between at least some of the plurality of phase sweeps;

wherein the phase step increment changes between at least some of the plurality of phase sweeps; and wherein the OPA controller is configured to perform beamforming using the OPA by sending control signals to the OPA control circuitry based upon the calibration phase state information.

20. A method of calibrating an optical phase array (OPA) comprising a plurality of branches that are each connected to separate optical elements and each include a phase shifter, the method comprising:

sending control signals to control circuitry in the OPA to perform a plurality of phase sweeps using each of a plurality of different basis masks, where each phase sweep comprises:

performing a phase sweep across a phase sweep range at a plurality of phase step increments with respect to a first group of phase shifters identified in a basis mask, where the first group of phase shifters comprises a plurality of phase shifters; and measuring a calibration signal at each of the plurality of phase step increments during the phase sweep; and generating calibration phase state information based upon the measured calibration signals.

\* \* \* \* \*